United States Patent [19]

Iwai

[11] Patent Number: 4,491,486
[45] Date of Patent: Jan. 1, 1985

[54] METHOD FOR MANUFACTURING A SEMICONDUCTOR DEVICE

[75] Inventor: Hiroshi Iwai, Tokyo, Japan

[73] Assignee: Tokyo Shibaura Denki Kabushiki Kaisha, Japan

[21] Appl. No.: 418,802

[22] Filed: Sep. 16, 1982

[30] Foreign Application Priority Data

Sep. 17, 1981 [JP] Japan ............................. 56-146547
Oct. 9, 1981 [JP] Japan ............................. 56-161312

[51] Int. Cl.³ ........................................... H01L 21/76
[52] U.S. Cl. ............................... 148/105; 357/50;
29/576 W; 29/578; 29/580
[58] Field of Search .................. 357/50, 49, 55, 56;
29/580, 578, 576 W; 148/105, 187, 175

[56] References Cited

U.S. PATENT DOCUMENTS

| | | | |
|---|---|---|---|
| 3,966,577 | 6/1976 | Hochberg | 204/192 |
| 3,972,751 | 8/1976 | Riseman | 148/175 |
| 3,997,318 | 12/1976 | Kaji et al. | 148/174 |
| 4,032,373 | 6/1977 | Koo | 148/175 |
| 4,042,726 | 8/1977 | Kaji et al. | 127/93 |
| 4,044,452 | 8/1977 | Abbas et al. | 29/571 |
| 4,104,086 | 8/1978 | Bonder et al. | 148/1.5 |
| 4,109,090 | 8/1978 | Pogge | 148/175 |
| 4,139,442 | 2/1979 | Bonder et al. | 204/192 E |
| 4,140,558 | 2/1979 | Murphy et al. | 148/178 |
| 4,209,380 | 6/1980 | Ho et al. | 148/188 |
| 4,211,582 | 7/1980 | Horng et al. | 148/1.5 |
| 4,318,751 | 3/1982 | Horng | 148/1.5 |
| 4,338,138 | 7/1982 | Cavaliere et al. | 148/1.5 |
| 4,369,565 | 1/1983 | Muranatsu | 29/580 |
| 4,378,630 | 4/1983 | Horng et al. | 29/580 |
| 4,390,393 | 6/1983 | Ghezzo et al. | 156/643 |

Primary Examiner—L. Dewayne Rutledge
Assistant Examiner—Christopher Biody
Attorney, Agent, or Firm—Finnegan, Henderson, Farabow, Garrett & Dunner

[57] ABSTRACT

A method is proposed for manufacturing a semiconductor device, which comprises forming groove(s) having a vertical wall in a semiconductor substrate; doping the same type of impurity as that of the substrate at a dose of not less than $1 \times 10^{14}$ cm$^{-2}$ or the opposite type of impurity to that of the substrate in said groove(s) to form an impurity region; filling the groove(s) with an insulating material to form a field region. A semiconductor device having an impurity region of the same conductivity type as that of the semiconductor substrate under a buried field region and of a sheet resistance $\rho s = 50$ ohms/□ is also proposed.

39 Claims, 96 Drawing Figures

METHOD FOR MANUFACTURING A SEMICONDUCTOR DEVICE

BACKGROUND OF THE INVENTION

The present invention relates to a semiconductor device and a method for manufacturing the same and, more particularly, to an improvement in an element isolation technique of a metal oxide semiconductor large scale integrated circuit (MOSLSI) together with an improvement in a diffusion wiring layer and stabilization of a substrate potential.

Selective oxidation is generally adopted to isolate semiconductor elements from each other in the process for manufacturing a semiconductor device, especially, a MOSLSI. The selective oxidation will be described with reference to an n-channel MOSLSI.

As shown in FIG. 1A, an $SiO_2$ film 2 is grown on a p-type silicon substrate 1 which has a crystal plane of (100). An $Si_3N_4$ film 3 is then deposited on the $SiO_2$ film 2. A photoresist pattern 4 which corresponds to a prospective element formation region is formed by photo-etching. Using the photoresist pattern 4 as a mask, part of the $Si_3N_4$ film 3 which does not correspond to the prospective element formation region is etched to form an $Si_3N_4$ pattern 3'. Thereafter, boron is ion-implanted to form a p+-type region 5 as a channel stopper in the field region (FIG. 1B). After the photoresist pattern 4 is removed, a thick field oxide film 6 is selectively grown by wet oxidation using the $Si_3N_4$ pattern 3' (FIG. 1C) as a mask. The $Si_3N_4$ pattern 3' and the $SiO_2$ film 2 are etched, and an element formation region 7 which is isolated by the field oxide film 6 is formed (FIG. 1D). As shown in FIG. 1E, a gate electrode 9 which comprises polycrystalline silicon is formed in the element formation region 7 through a gate oxide film 8. Arsenic is ion-implanted in the element formation region 7 and is thermally diffused to form n+-type regions 10 and 11 which are respectively defined as the source and drain. A CVD-$SiO_2$ film 12 which functions as an insulating interlayer is deposited. Contact holes 13 which correspond to the n+-type regions 10 and 11 and the gate electrode 9 are formed in the CVD-$SiO_2$ film 12. Aluminum wirings 14 are deposited in the contact holes 13 to prepare an n-channel MOSLSI (FIG. 1F).

However, the various drawbacks are presented by the above-mentioned conventional thermal oxidation method for manufacturing the MOSLSI.

FIG. 2 is a detailed sectional view showing a structure when the field oxide film 6 is formed using the $Si_3N_4$ pattern 3' as a mask, shown in FIG. 1C. Generally, in the selective oxidation method, it is known that the field oxide film 6 grows to extend under the $Si_3N_4$ pattern 3' (region F in FIG. 2). Since an oxidant is diffused through the thin $SiO_2$ film 2 under the $Si_3N_4$ pattern 3' during field oxidation, the field oxide film 6 has a portion D which is a bird's beak and a portion E which is a thick portion along the transverse direction of the field oxide film 6. The length of region F is about 1 μm when the field oxide film 6 of 1 μm thickness is grown under the condition that the $Si_3N_4$ pattern 3' and the $SiO_2$ film 2 have the thickness of 1,000 Å. A width C of the field region cannot be less than 4 μm since the length of the region F is 1 μm when a distance A between the $Si_3N_4$ patterns 3' is 2 μm. As a result, a highly integrated LSI cannot be obtained. In order to eliminate the above drawback, a method has been recently proposed wherein the thickness of the $Si_3N_4$ pattern 3' is increased and the thickness of the underlying $SiO_2$ film 2 is decreased to prevent the bird's beak (portion D). Alternatively, another method is proposed wherein the thickness of the field oxide film 6 is decreased to prevent formation of the region F. However, in the former method, the mechanical stress at the end of the field region is increased, resulting in the defective LSI. In the latter method, the field inverted voltage is decreased. Thus, high integration by the selective oxidation method is limited.

When boron is ion-implated to form a channel stopper, boron is transversely diffused during the field oxidation. Part of the element formation region 7 becomes the p+-type region 5 as shown in FIG. 3A due to redistribution of boron previously ion-implanted for the channel stopper in the transverse direction during field oxidation. The width of the effective element region is decreased from a width G to a width H. As a result, a current flowing through the transistor is decreased, and the threshold voltage is increased, resulting in the narrow channel effect. This effect is a significant problem when the semiconductor element is micronized. Further, since the p+-type region 5 extends transversely, the p-n junction between the n+-type region 11 (10) and the p+-type region 5 is widened as shown in FIG. 3B. The stray capacitance between the substrate 1 and the n+-type regions 10 and 11 is increased. The stray capacitance cannot be neglected when the semiconductor element is micronized.

As described above, various problems are presented in manufacture of an LSI of a high packing density when the selective oxidation method is used. Further, the problems are described with reference to FIGS. 4 to 6.

It is generally difficult to cross an n+-type wiring layer 10' and a polycrystalline silicon electrode 9' on the field oxide film 6 (FIG. 4). In order to cross the wiring layer 10' and the electrode 9', the n+-type layer 10'' must be formed under the field oxide film 6. For this purpose, an impurity such as phosphorus or arsenic must be doped prior to field oxidation. In this case, since the concentration of the impurity is generally high, the n-type doped impurity is out-diffused at the initial period of field oxidation, so that the p-type region on the surface of the substrate may often be changed to an n-type region. When an n-type impurity is diffused in a gate region 1', the threshold voltage of the transistor is decreased. Further, according to the above method, when the n+-type region is formed under the field oxide film 6, margin M1 between the n+-type layers 10 and 10'' and margin M2 between the n+-type layers 10''' and 10' must be formed to isolate the n+-type layers 10, 10' and 10'''. Therefore, the field width becomes as great as M1+M+M2, and a highly integrated circuit cannot be provided.

Further, according to the conventional selective oxidation method, the following problems are also presented which will be described with reference to FIG. 7.

In order to package an LSI pellet, a substrate 1 is mounted on a bed 15 of the package. When the LSI is operated, the potentials of element regions $16_1$ to $16_3$ for the source, drain and so on fluctuate in accordance with the operation state. In this case, a current flows through the substrate 1 in accordance with changes in the potentials of the element regions $16_1$ to $16_3$. For example, with respect to the element region $16_1$, the current flows through a path of the element region $16_1$, a resistor R1, the bed 15, the element region $16_1$, a register R2, the bed 15, the element region $16_1$, a register R5, the bed 15 and so on when the bed 15 is electrically conductive and the substrate 1 is electrically connected to the bed 15. A potential of the substrate 1 in the vicinity of the element region $16_1$ fluctuates in correspondence with a voltage drop due to the current flow described above. However, such a variation in the potential is undesirable for circuit operation. Especially, when the voltage of the element region $16_1$ is changed and when the potential of the element region $16_2$ is not changed, the potential of the substrate 1 in the vicinity of the part between the element regions $16_1$ and $16_2$ is changed. Thus, electrical characteristics of the element vary in accordance with points on the pellet, which is inconvenient. For stabilizing the electrical characteristics, the internal resistance of the substrate must be decreased. However, the resistance of resistors R5 to R8 and resistors R9 to R11 is determined by the impurity concentration of the substrate and the film thickness of the substrate which is connected to the bed. In general, the resistance of the resistors R5 to R8 and R9 to R11 is about hundred ohms to several hundreds of ohms. Therefore, the internal resistance can hardly be decreased. The resistance of the resistors R1 to R4 can be decreased regardless of the electrical characteristics of the element since these resistors provide the internal resistance of the field region 6. However, according to the conventional method described above, the concentration of the p-type impurity cannot be increased, so the resistance is very high. For example, the impurity is ion-implanted in the field region at a dose of $1 \times 10^{13}$ cm$^{-2}$, and the sheet resistance of the p$^+$-type layer is about 10 kilohms/□.

SUMMARY OF THE INVENTION

The present invention has been made to eliminate the above problems and has for its object to provide a semiconductor device and a method for manufacturing the same, wherein a high packing density and a high performance are accomplished by a novel element isolation technique.

According to a first feature of the present invention, a mask such as a photoresist pattern is formed in a region of a semiconductor substrate except for the groove formation region and the exposed portion of the substrate is selectively etched by reactive ion etching to a desired depth to form a groove, using the photoresist pattern as a mask. In this case, the wall of the groove can be formed substantially vertical if reactive ion is adopted. However, any other etching means may be used to form an inverted tapered groove. At least one groove may be formed. Further, the depth of the groove may be changed from one groove to another.

An impurity whose conductivity type is opposite to that of the substrate (if a p-type substrate is used, phosphorus or arsenic is used as the impurity; if an n-type substrate is used, boron is used as the impurity) is ion-implanted at a dose of $1 \times 10^{16}$ cm$^{-2}$ in the groove using the photoresist pattern as the mask. Alternatively, the impurity is diffused. Prior to the doping of the impurity, a photoresist pattern may be formed to cover part of the groove or some grooves, and doping may be performed. Further, if the n$^+$-type region defines part of the groove, boron whose conductivity type is the same as the substrate may be doped in part or over all the groove to form a channel stopper. Further, the impurity may be obliquely or transversely diffused to form an impurity region in the side surfaces of the groove.

Further, the depth of the groove is made greater than a diffusion depth xj of the diffusing region for forming the source and drain in the subsequent process. Generally, the depth of the groove must be smaller than the depth xj when it is desired to isolate the n$^+$-type buried region and the n$^+$-type source and drain regions or to electrically contact the n$^+$-type buried region with the n$^+$-type source and drain regions.

After the photoresist film mask is removed, an insulating film is deposited to cover the entire surface of the semiconductor substrate, including the area of the groove, to a thickness at least greater than half the width of the shorter side of the opening of the groove. Thus, the insulating film is deposited to fill at least one groove. The insulating film may comprise SiO$_2$, Si$_3$N$_4$ or Al$_2$O$_3$. In some cases, a low-melting point insulating material such as phosphorus silicate glass (PSG), boron silicate glass (BSG), and the like may be used for the insulating film. The insulating material described above may be deposited by the CVD method, the PVD method, such as the sputtering method, or the like. Upon deposition of the insulating material to a thickness less than half the width of the shorter side of the opening of the groove, a recess which communicates with the opening of the insulating material filled in the groove is formed. The insulating material in the groove is etched through the recess, which is inconvenient.

It is noted that the entire surface of the semiconductor substrate has grooves prior to deposition of the insulating material, and at least part of the groove may be oxidized or nitrified to form an oxide or nitride film so as not to block the groove.

Doping of the impurity may be performed before or after the oxide or nitride film is formed. When oxidation or nitrification is performed, the resultant field region comprises the insulating film and the dense oxide or nitride film which contacts the grooved part of the substrate. As compared with the field region which only comprises the insulating film, the element isolation performance is greatly improved. Further, after the insulating material is deposited, a low-melting point material such as boron, phosphorus, or arsenic is doped on part or all of the surface layer of the insulating film. Thereafter, the insulating film is annealed to melt the doping layer. Alternatively, a low-melting point insulating material such as BSG, PSG and arsenic silicate glass (AsSG) may be deposited on part or all of the insulating film and may be melted. With the above process, if part of the insulating film which corresponds to the groove is recessed, the recess can be filled with the low-melting point insulating material to smoothen the surface of the insulating film. As a result, the insulating material left in the groove may not be lower than the level of the opening of the groove when the entire surface of the insulating film is uniformly etched.

The insulating film deposited on the semiconductor substrate is etched without using the mask until the surface of the semiconductor substrate, except for the inner wall and bottom of the groove, is exposed. Thus, the insulating material is left in the groove to form a field region. In this case, entire surface etching using a liquid etchant or a plasma etchant, or reactive ion etching can be adopted. Thereafter, active elements such as a MOS element or bipolar semiconductor element are formed in the element formation region which is isolated by the field region to prepare a semiconductor device.

As may be apparent from the above description, according to the first feature of the present invention, a groove is formed in the semiconductor substrate, and an impurity whose conductivity type is opposite to that of the substrate is ion-implanted or is diffused. Thereafter, an insulating material is deposited to cover the entire surface of the substrate, including the groove, to a thickness greater than half the width of the shorter side of at least one groove. The insulating film is then etched to expose the surface of the substrate and to leave the insulating material in the groove. Without providing a margin for mask alignment, the buried diffusion layer can be formed in the groove in a self-aligned manner. Further, the insulating material can be left on the buried diffusion layer, so that the field region can be readily formed. Therefore, the following effects are obtained:

(1) Since the area of the field region is determined by the area of the groove preformed in the substrate, a desired small field region can be readily obtained by decreasing the area of the groove, thus providing a highly integrated semiconductor device.

(2) Since the depth of the field region can be determined by the depth of the groove formed in the substrate independently of the area of the groove, the depth of the field region can be arbitrarily determined. Further, flow of leakage current between the adjacent semiconductor elements can be properly prevented by the field region, thus providing a high-performance and highly reliable semiconductor device.

(3) Thermal oxidation at a high temperature for a long period of time, which is performed in the conventional selective oxidation method, need not be performed after the impurity which is used for diffusion later is selectively doped in the groove, preventing a conventional drawback wherein the impurity is redistributed from the impurity region onto the surface of the element formation region to decrease the effective field region. Further, another conventional drawback is prevented wherein the impurity is out-diffused and the impurity is doped on the surface of substrate. In this case, if the impurity is ion-implanted, the impurity region can be formed at the bottom of the groove. Even if the impurity is redistributed from the impurity region, the impurity region may not extend to the surface layer (element formation part) of the element formation region. Thus, the effective field region may not be decreased.

(4) As a result of effect (3), the concentration of the impurity can be increased, so that the resistance of the buried wiring can be decreased.

(5) Since the substrate is smoothened if the field region is formed by leaving the insulating material so as to fill the groove, excellent step coverage is provided when an electrode material is deposited in the contact holes.

(6) In the structure where the $n^+$-type layer is formed under the field region, electrons can be absorbed in the $n^+$-type layer when the alpha rays are incident on the substrate, so soft error does not occur. Further, in order to increase this effect, the potential of the $n^+$-type layer under the field region must be positive.

A second feature of the present invention will be described in detail.

After the impurity is doped in the groove in the same process as described with reference to the first feature, an insulating material is deposited to cover the entire surface of the semiconductor substrate to a thickness greater than half of the shorter width of an opening of at least one groove. Subsequently, a mask such as a photoresist pattern is formed on one or both of a first portion of the insulating film which includes at least part of the groove filled with the insulating material to its opening, and a second portion of the insulating film which excludes the groove and is defined as the prospective field region. The exposed portion of the insulating film is etched to expose the surface of the substrate and to leave the insulating material in the groove, using the photoresist film as the mask. Thus, the field region is formed in the groove and on the substrate. In this case, the field region formed on the substrate includes a field region integrally formed with the field region in the groove. Thereafter, active elements such as a MOS element or bipolar semiconductor element are formed in the element formation region isolated by the field region to prepare a semiconductor device.

According to the second feature of the present invention, in addition to effects (1) to (6), a further effect is obtained wherein a semiconductor device has a field region which comprises the field region embedded in the semiconductor substrate and the field region which is formed on the semiconductor substrate part excluding the grooved part and which is integral with the field region embedded in the substrate or is separated therefrom.

A third feature of the present invention will be described in detail.

After a mask such as a photoresist pattern is formed on the semiconductor substrate except for at least two adjacent prospective groove formation regions, the exposed portion of the substrate is selectively etched to a desired depth. Thus, first grooves are formed which include at least two adjacent grooves. In addition to a set of at least two adjacent grooves, the first grooves may include at least one groove which is apart from the set of grooves.

An impurity whose conductivity type is opposite to that of the substrate is doped in the first grooves, using the photoresist pattern as the mask. Subsequently, after removing the mask, an insulating material is deposited to cover the entire surface of the semiconductor substrate, including the first grooves, to a thickness greater than half the width of the shorter side of the opening of the set of at least two adjacent grooves. Thus, the first grooves are completely filled with the insulating material. The insulating material may comprise $SiO_2$, $Si_3N_4$ or $Al_2O_3$. In some occasions, a low-melting point insulating material such as PSG, AsSG or BSG may be used as the insulating material. The insulating material is deposited by the CVD method or the PVD method, such as sputtering. Prior to deposition of the insulating material, an impurity whose conductivity type is the same as the substrate may be doped in parts of the first grooves to form a channel stopper region in the substrate. Further, prior to deposition of the insulating material, the surface layer of the semiconductor substrate which has the first grooves, or part of the surfaces of the grooves may be oxidized or nitrified so as not to block the grooves. Further, after the insulating material is deposited, a low-melting point insulating material may be formed thereon.

The insulating film deposited on the semiconductor substrate is etched by exclusive etching using a liquid etchant or plasma etchant, or reactive ion etching without using a mask to expose the surface of the semiconductor substrate except for the first grooves, so that the insulating material is left in the set of at least two adjacent grooves to the level of their openings.

The exposed part of the semiconductor substrate which is located between the set of at least two adjacent grooves filled with the insulating material is selectively etched to form a second groove between the first grooves. In this case, the insulating material is filled in the first grooves and is not substantially etched, while the semiconductor substrate is etched. Therefore, the second groove can be formed in a self-aligned manner even if part of the first grooves which include at least two adjacent grooves is exposed. After the impurity whose conductivity type is opposite to that of the substrate is doped in the second groove as needed, an insulating material is deposited to cover the entire surface of the substrate to a thickness less than half the width of the shorter side of the opening of the second groove. The insulating materials described above can also be applied to this case. Subsequently, the insulating film is etched to expose the surface of the semiconductor substrate and to leave the insulating material in the second groove. The insulating material left in the first grooves which are located at two sides of the second groove is formed integrally with the insulating material left in the second groove. Thus, a wide field region is prepared. Thereafter, active elements such as a MOS element or a bipolar semiconductor element are formed in the element formation region isolated by the field region to prepare a semiconductor device.

According to the third feature of the present invention, in addition to effects (1) to (6) of the second feature, a field region which has a wide width without having a step can be obtained to provide a highly integrated, highly reliable, and high-performance semiconductor device.

A fourth feature of the present invention will be described in detail.

A mask such as a photoresist pattern is formed on the semiconductor substrate except for the prospective groove formation region. Thereafter, the exposed portion of the substrate is selectively etched by the same etching means as described above to a desired depth to form first grooves.

An impurity whose conductivity type is opposite to that of the substrate is doped in at least part of the first grooves. Subsequently, the mask is removed, and the insulating material is deposited to cover the entire surface including the first grooves in the same manner as described above.

The insulating film is etched without using the mask to expose the surface of the substrate and to leave the insulating material in the first grooves. Thereafter, an antioxidant film is selectively formed on the surface of the semiconductor substrate directly or through the insulating film. The antioxidant film may comprise a $Si_3N_4$ film or $Al_2O_3$ film. The part between the first grooves is selectively etched using the antioxidant film as a mask so that a second groove is formed between the first grooves. Field oxidation is then performed using the antioxidant film to fill the second groove with an oxide (insulating) film. The insulating film left in the first grooves is formed integrally with that of the second groove to prepare a wide field region.

The first to fourth features are all concerned with the formation of wiring layers for isolating semiconductor elements by diffusing (or ion-implanting) an impurity whose conductivity type is opposite to that of the substrate.

In fifth to ninth features of the present invention to be described below, an impurity whose conductivity type is the same as that of the substrate is diffused (or ion-implanted) in the groove to stabilize the substrate potential.

According to the fifth feature of the present invention, the process for ion-implanting or diffusing the impurity into the groove is the same as that in the first feature except that an impurity whose conductivity type is the same as that of the substrate (boron is ion-implanted or diffused in a p-type substrate; phosphorus is ion-implanted or diffused in an n-type substrate) at a dose of $1 \times 10^{14}$ cm$^{-2}$ or more.

According to the fifth feature of the present invention, the groove is formed in the semiconductor substrate. The impurity whose conductivity type is the same as that of the substrate is doped at a predetermined dose. An insulating material is then deposited to cover the entire surface of the substrate including the groove to a thickness greater than half the width of the shorter side of an opening of at least one groove. The insulating film is then etched to expose the substrate and to leave the insulating material in the groove. Thus, a buried diffusion layer is formed with respect to the groove in a self-aligned manner without a mask alignment margin. The insulating material can be formed on the buried diffusion layer to form the field region. Therefore, in addition to effects (1), (2) and (5) of the first feature, the various effects are provided to be described below:

(1) Since thermal oxidation at a high temperature for a long period of time need not be performed unlike the conventional selective oxidation method, after an impurity for forming a channel stopper is selectively doped in the groove, a conventional drawback is eliminated wherein the impurity is redistributed from the impurity region to extend to the surface of the element formation region so that the effective field region is decreased. Further, another conventional drawback is also eliminated wherein the impurity is out-diffused and is doped again on the surface of the substrate. If the impurity is ion-implanted, the impurity region can be formed in the bottom of the groove. Further, even if the impurity is diffused again from the impurity region, the impurity region may not extend to the surface layer (element formation layer) of the element formation region. Therefore, the effective field region does not decreased.

(2) As a result of effect (1) described above, since the concentration of the impurity can be increased, the internal resistance in the impurity region can be decreased. The variations of substrate potential at positions on the chip can be eliminated.

A sixth feature of the present invention will be described.

The sixth feature is the same as the second feature except that an impurity whose conductivity type is the same as that of the substrate is ion-implanted (boron is used for a p-type substrate; phosphorus or arsenic is used for an n-type substrate) at a dose of $1 \times 10^{14}$ cm$^{-2}$ or more, or is diffused in the ion-implantation or diffusion of the impurity in the groove.

According to the sixth feature of the present invention, in addition to the various effects of the fifth feature, a further effect is obtained wherein a semiconductor device has the field region embedded in the semiconductor substrate and the field region which is formed on the semiconductor substrate except for the groove, and which is integral with the embedded field region or is separated therefrom.

A seventh feature of the present invention will be described below.

The seventh feature is the same as the third feature except that an impurity whose conductivity type is the same as that of the substrate is ion-implanted or doped at a dose of $1 \times 10^{14}$ cm$^{-2}$ in the ion-implantation or diffusion of the impurity in the groove.

According to the seventh feature of the present invention, in addition to the effects of the fifth feature, a further effect is obtained wherein the wide field region without any step can be formed to provide a highly integrated, highly reliable and high-performance semiconductor device.

An eighth feature of the present invention will be described.

The eighth feature is the same as the fourth feature except that an impurity whose conductivity type is the same as that of the substrate is ion-implanted or doped at a dose of $1 \times 10^{14}$ cm$^{-2}$ or more in the ion-implantation or diffusion step of the impurity in the groove.

According to a ninth feature, a semiconductor device can be obtained wherein the sheet resistance ps of the impurity region is 50 ohms/□ or less and its conductivity type is the same as that of the substrate. It is noted that the internal resistance is limited to eliminate adverse effects of a great potential difference between the semiconductor elements formed on the substrate when the semiconductor device is operated since the substrate resistance under the field region cannot be sufficiently decreased when the LSI pellet is mounted on the bed of the package.

BRIEF DESCRIPTION OF THE INVENTION

Figure 9:
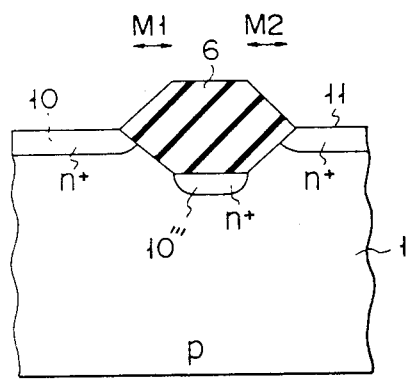
Figure 10:
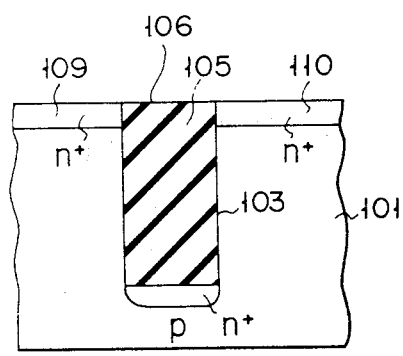
Figure 11:
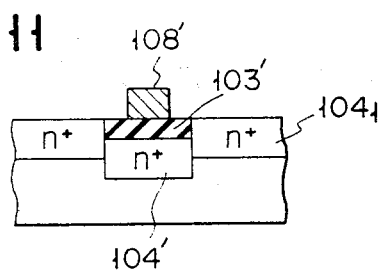
Figure 12:
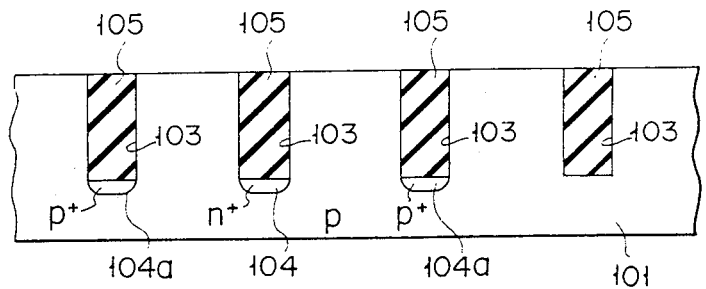
Figure 13:
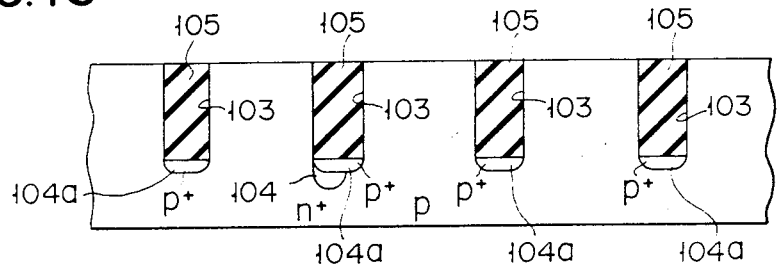
Figure 16A:
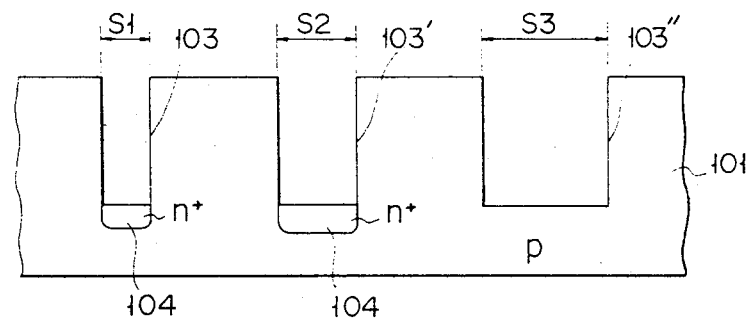
Figure 16B:
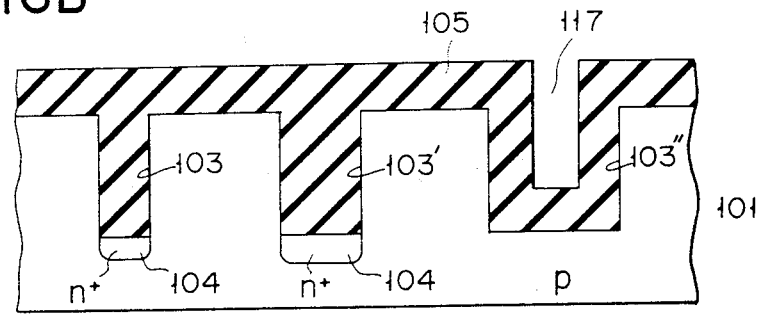
Figure 16C:
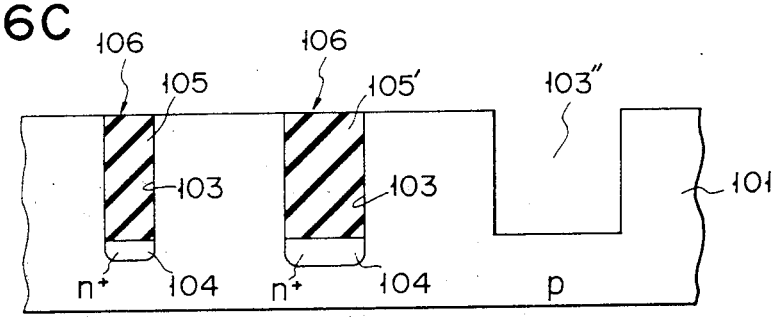
Figure 17A:
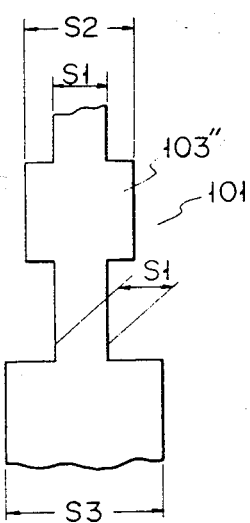
Figure 17B:
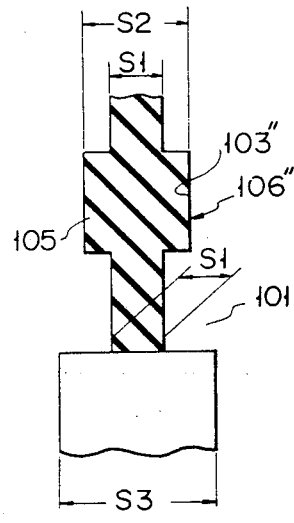
Figure 19A:
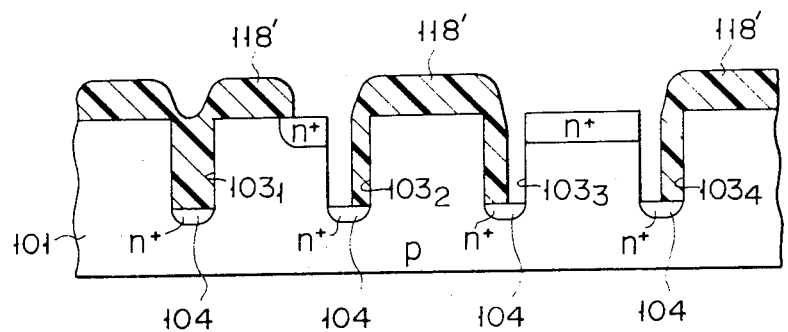
Figure 19B:
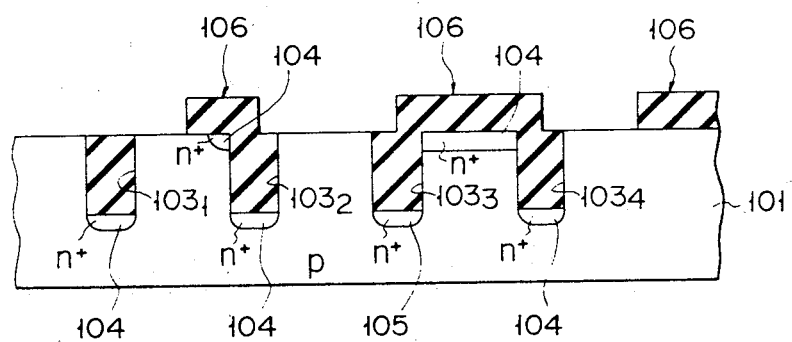
Figure 21:
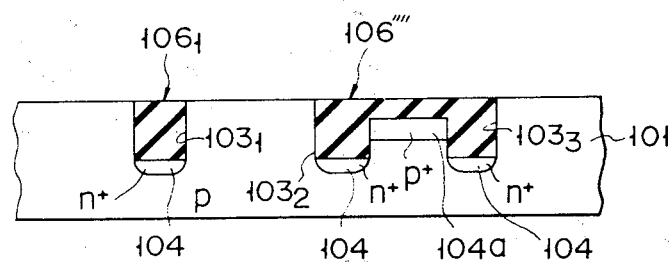
Figure 23A:
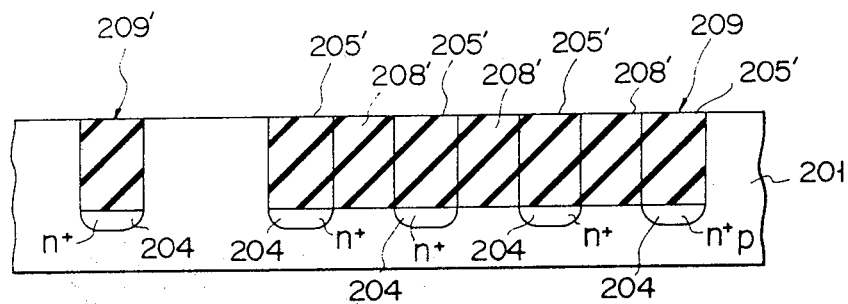
Figure 23B:
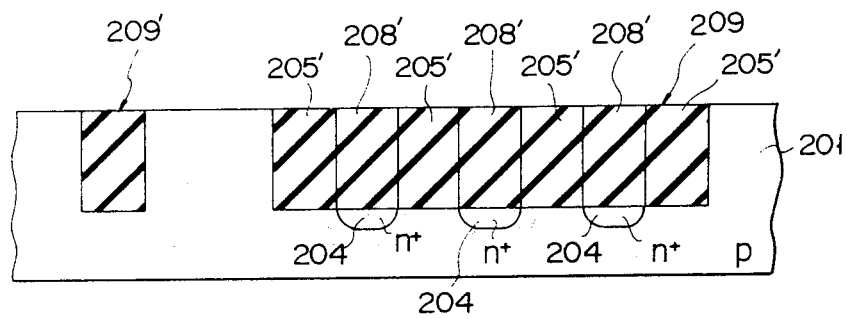
Figure 24:
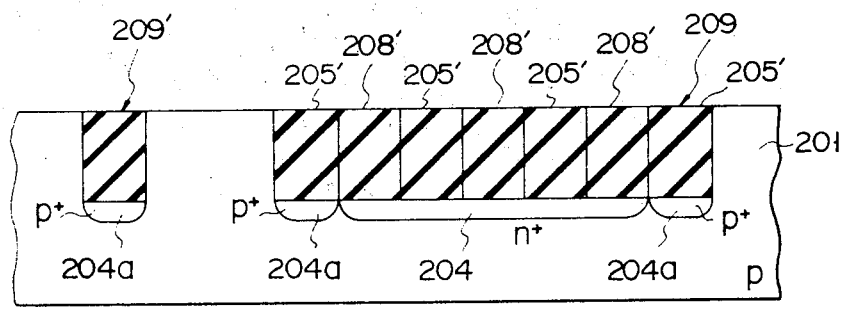
Figure 26:
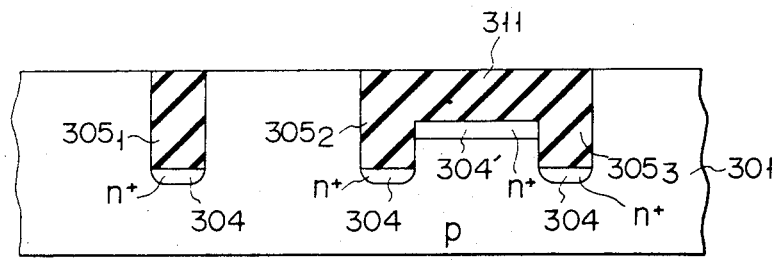
Figure 27:
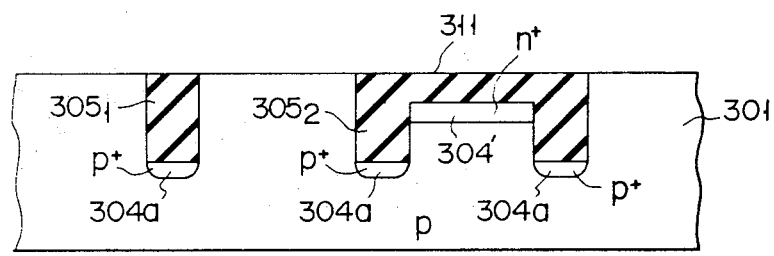
Figure 28:
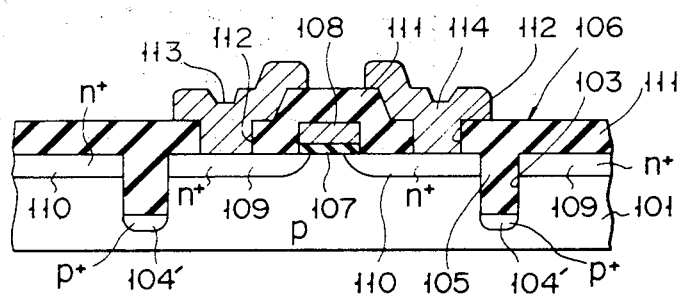
Figure 29:
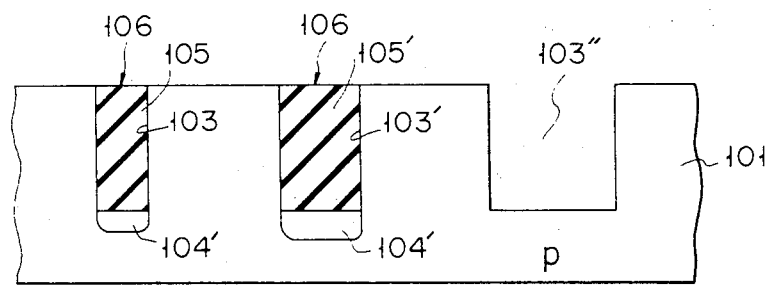
Figure 30:
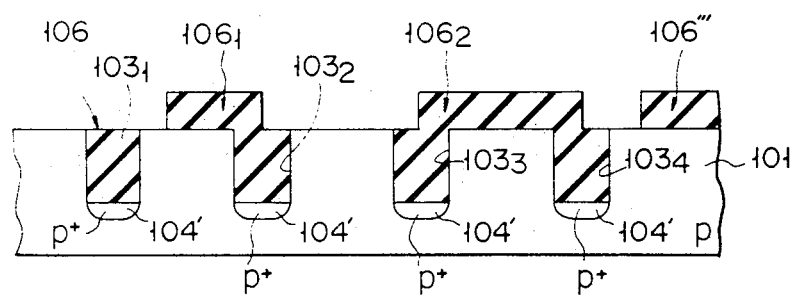
Figure 31:
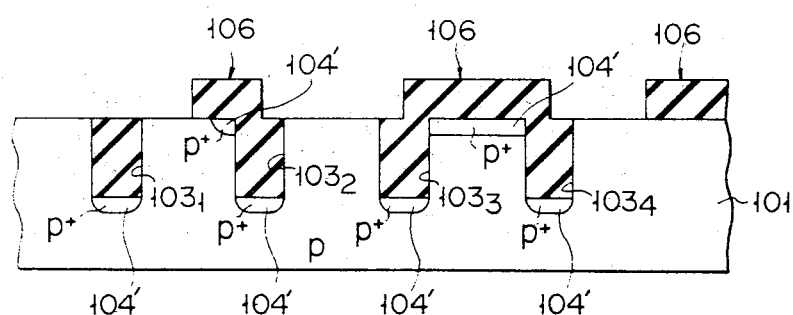
Figure 32:
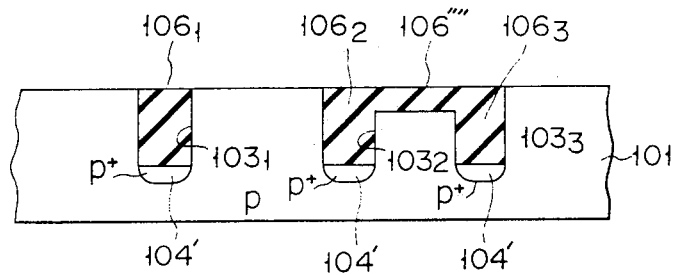
Figure 33:
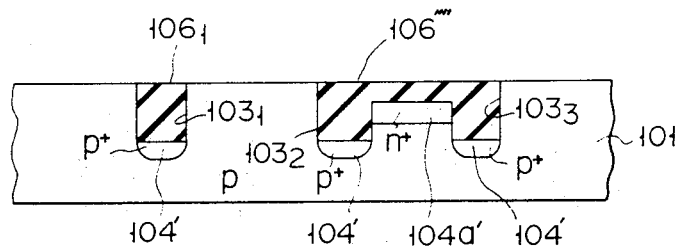
Figure 34:
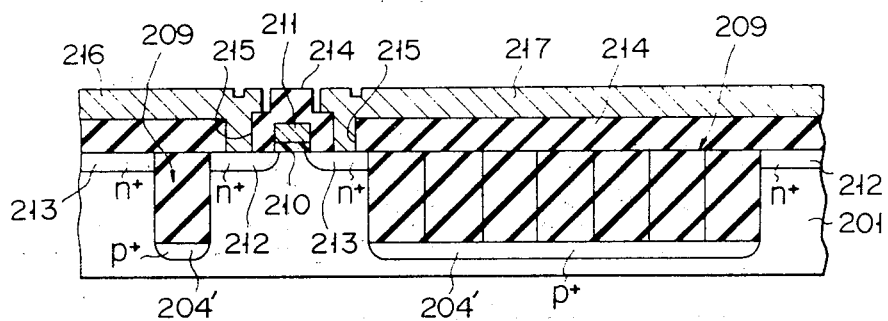
Figure 35A:
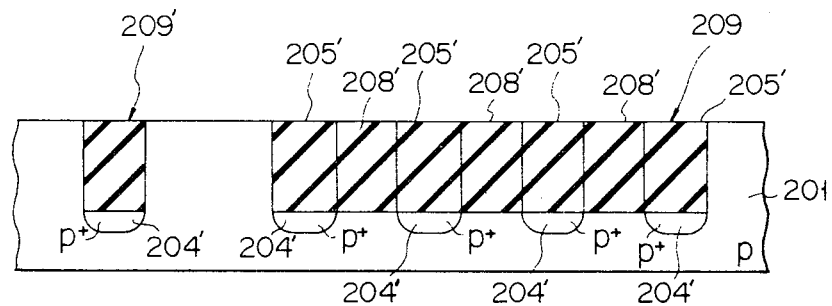
Figure 35B:
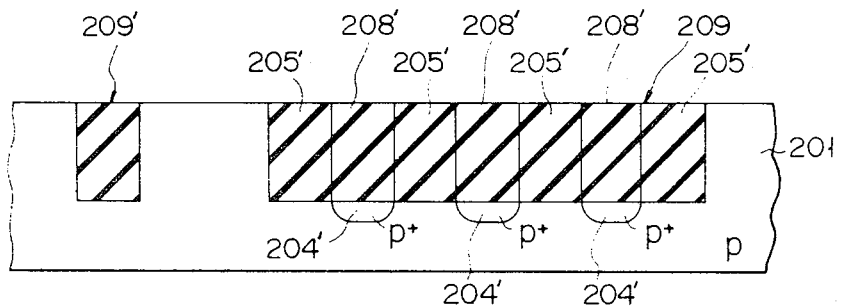
Figure 36:
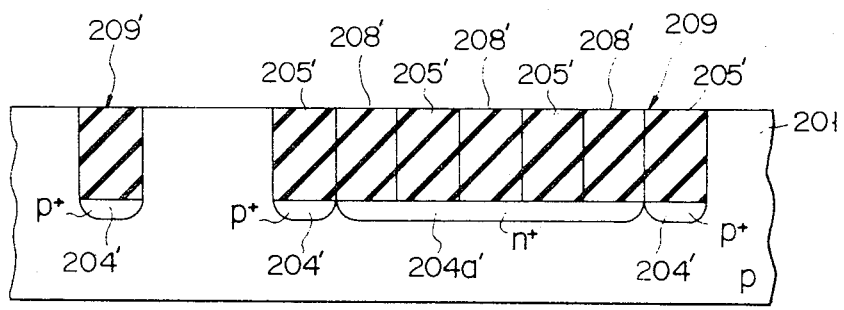
Figure 37:
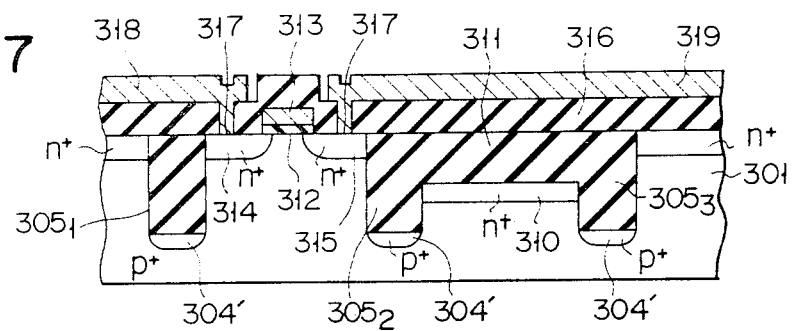
Figure 38:
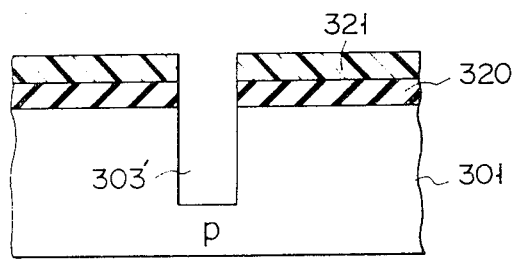
Figure 39A:
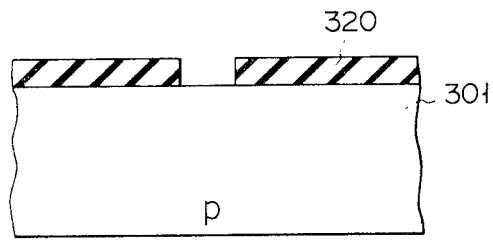
Figure 39B:
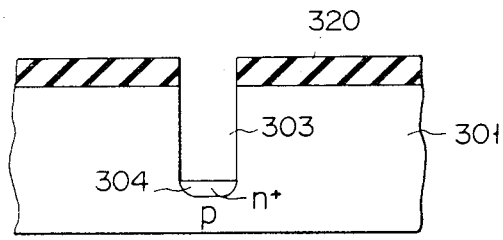
Figure 40:
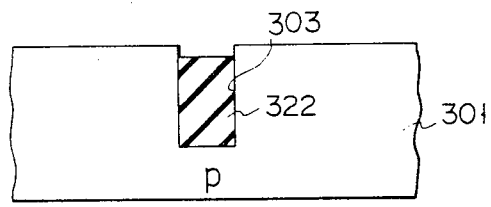
Figure 41A:
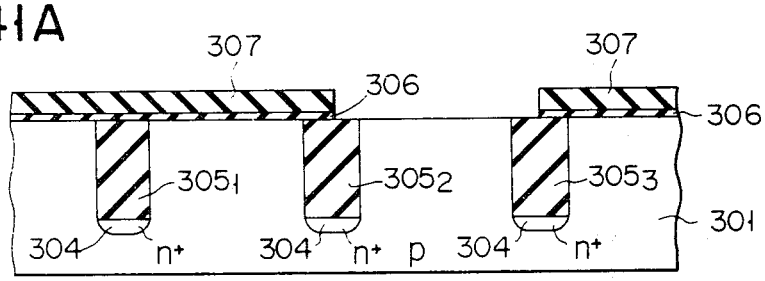
Figure 41B:
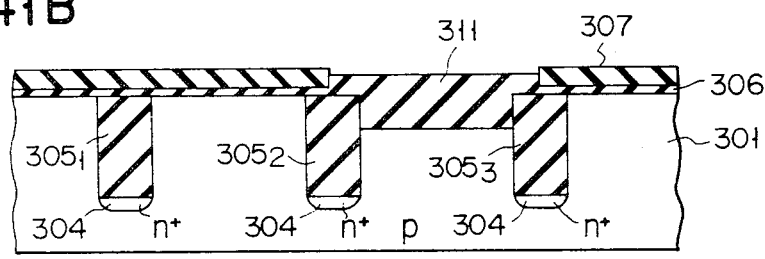
Figure 42:
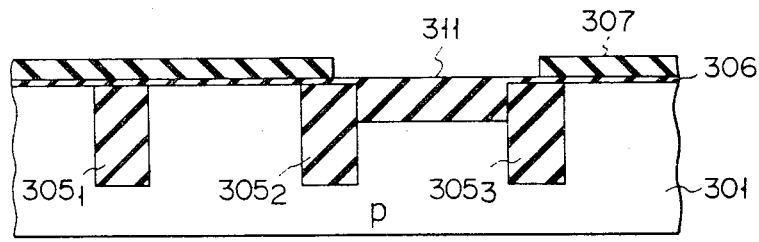

FIGS. 4 to 7 respectively show sectional views for illustrating the drift of electric potential of a semiconductor substrate to be generated when the conventional selective oxidization is employed;

FIGS. 8A to 8F are sectional views illustrating manufacturing steps of n-channel MOSLSI according to Example 1 of this invention;

FIGS. 9 and 10 show changes in distance between elements isolated by field regions to be formed according to the prior art and Example 1 respectively;

FIG. 11 is a sectional view showing a status wherein n+ region beneath the field region is contacted with n+ region on the surface of a semiconductor substrate by making shallow the depth of the groove in the substrate;

FIGS. 12 and 13 show respectively modified embodiments of Example 1;

FIGS. 14A, 14B, 15A and 15B show respectively sectional views illustrating manufacturing steps of groove as modifications of Example 1 of this invention;

FIGS. 16A to 16C show plan views illustrating the steps of forming field regions according to Example 2 of this invention;

FIGS. 17A and 17B show sectional views illustrating the steps of forming field regions according to Example 3 of this invention;

FIGS. 18A to 18D show sectional views illustrating the steps of forming field regions according to Example 4 of this invention;

FIGS. 19A and 19B show sectional views illustrating the steps of forming field regions according to the modification of Example 4;

FIGS. 20A to 20E show sectional view illustrating the steps of forming field regions according to Example 5 of this invention;

FIG. 21 is a sectional view showing a field region according to a modified embodiment of Example 5;

FIGS. 22A to 22J show sectional views illustrating manufacturing steps of MOSLSI according to Example 6 of this invention;

FIGS. 23A, 23B and FIG. 24 show sectional views illustrating the formation of field regions according to a modified embodiment of Example 6;

FIGS. 25A to 25K show sectional views illustrating manufacturing steps of MOSLSI according to Example 7;

FIGS. 26 and 27 respectively shows section view of a semiconductor substrate after the formation of field regions according to Example 7;

FIG. 28 is a sectional view illustrating n-channel MOSLSI according to Example 8;

FIG. 29 is a sectional view showing a semiconductor substrate after the formation of field regions according to Example 9;

FIG. 30 is a sectional view of MOSLSI after the formation of field regions according to Example 10;

FIG. 31 is a sectional view of MOSLSI after the formation of field regions according to the modified embodiment of Example 10;

FIG. 32 is a sectional view of MOSLSI after the formation of field regions according to Example 11;

FIG. 33 is a sectional view of a semiconductor substrate after the formation of field regions according to a modified embodiment of Example 11;

FIG. 34 is a sectional view of MOSLSI after the formation of field regions according to Example 12;

FIGS. 35A, 35B and FIG. 36 show respectively sectional view of a semiconductor substrate after the formation of field region according to the modified embodiments of Example 12;

FIG. 37 is a sectional view of MOSLSI after the formation of a field region according to Example 13;

FIGS. 38, 39A and 39B show sectional views of grooves in modifications of those of Example 7;

FIG. 40 show another embodiment of field region in modification of those of Example 7;

FIGS. 41A, 41B and 42 show another modified embodiments of field regions in modification of Example 7; and FIGS. 43, 44A, 44B, 45A, 45B, 46A and 46B respectively shows sectional view illustrating the steps of forming field regions according to other embodiments of this invention.

DETAILED DESCRIPTION OF THE PREFERRED EMBODIMENTS

Examples of the present invention will be described with reference to the accompanying drawings wherein the present invention is applied to the manufacture of an n-channel MOSLSI.

EXAMPLE 1

Figure 1A:
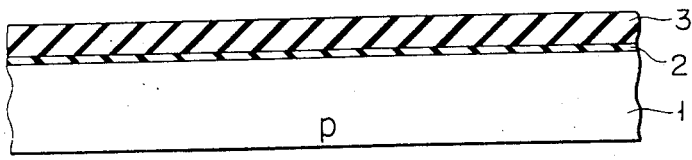
FIGS. 1A to 1F are sectional views showing sectional views illustrating the manufacturing steps by making use of the conventional selective oxidization method.
Figure 1B:
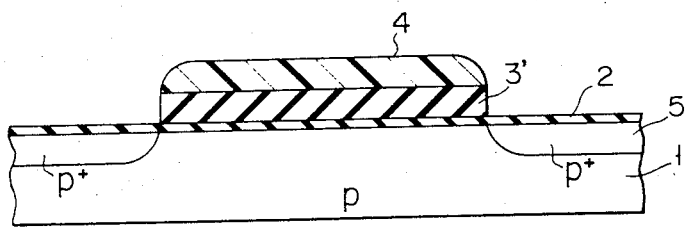
Figure 1C:
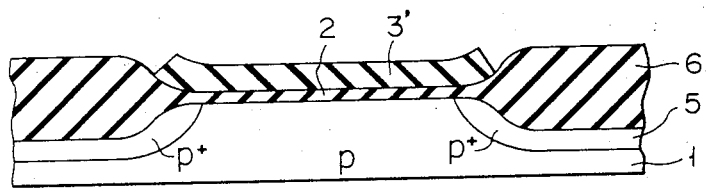
Figure 1D:
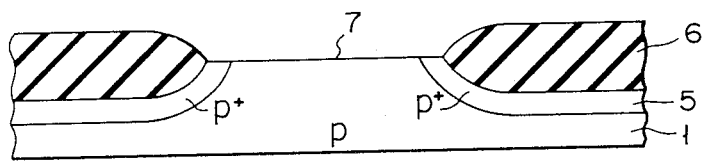
Figure 1E:
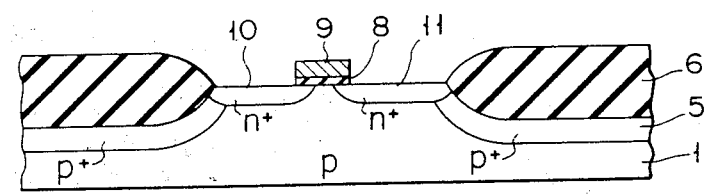
Figure 1F:
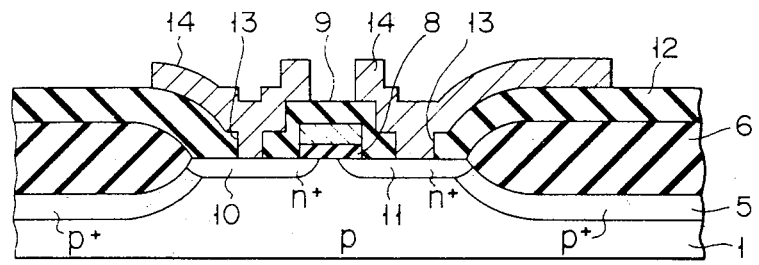
Figure 2:
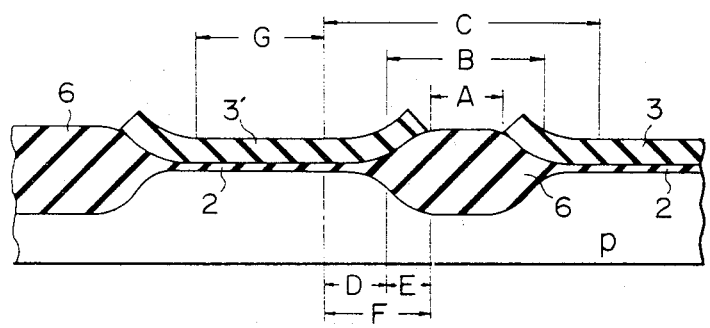
FIG. 2 is an enlarged sectional view of a semiconductor substrate after the selective oxidization process shown in FIGS. 1A to 1F.
Figure 3A:
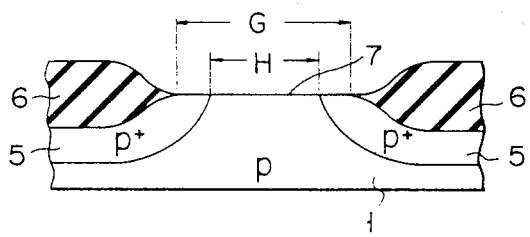
FIGS. 3A and 3B are sectional views illustrating the conventional selective oxidization method.
Figure 3B:
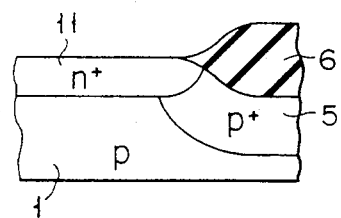
Figure 4:
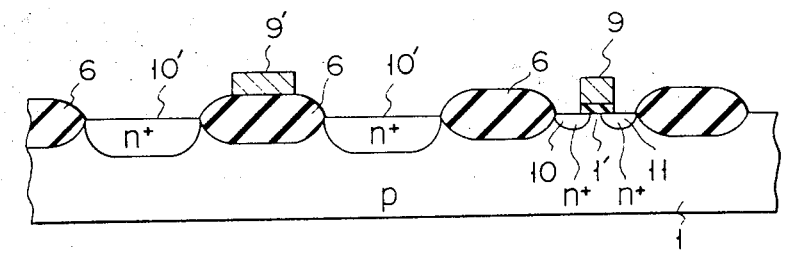
Figure 5:
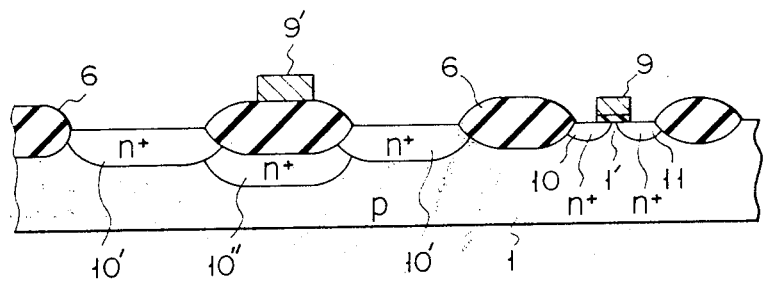
Figure 6:
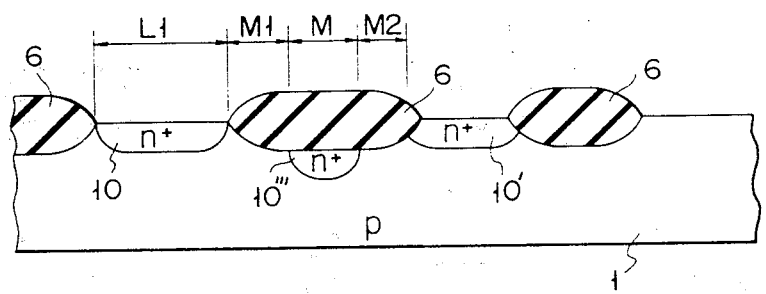
Figure 7:
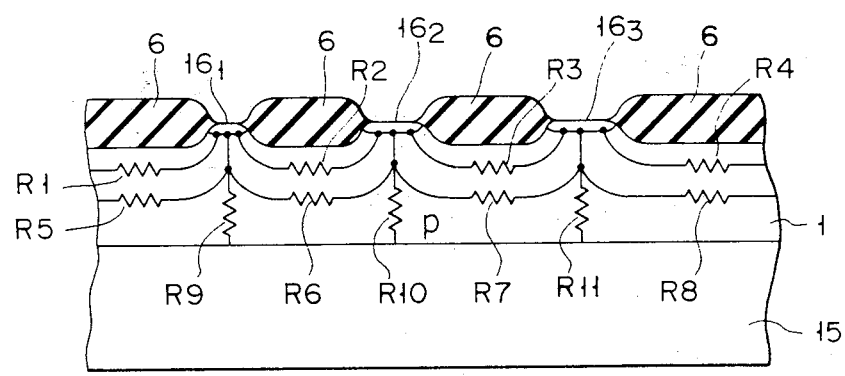
Figure 8A:
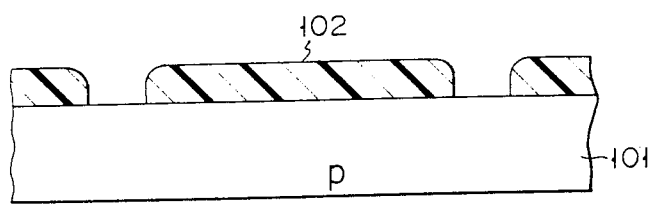
Figure 8B:
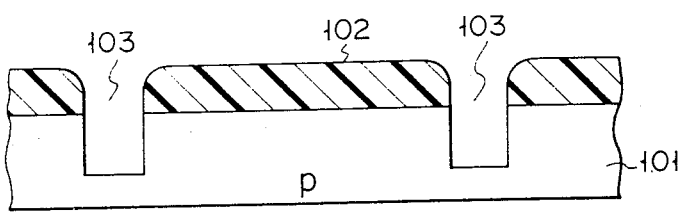
Figure 8C:
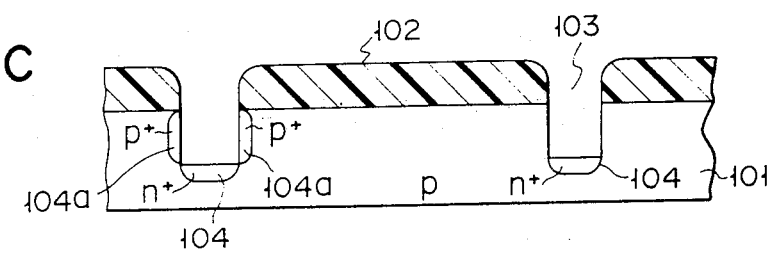

(i) A photoresist pattern 102 was formed by photoetching on a p-type silicon substrate 101 which has a crystal plane of (100) except for a prospective groove formation region (FIG. 8A). Subsequently, the exposed portion of the silicon substrate 101 was etched by reactive ion etching using the photoresist pattern 102 as a mask. At this time, as shown in FIG. 8B, lattice-shaped grooves 103 were formed, and each of the grooves 103 had a substantially vertical wall, and had a width of 1 μm and a depth of 2 μm. Phosphorus whose conductivity type was opposite to that of the p-type silicon substrate 101 was ion-implanted at a dose of $1 \times 10^{16}$ cm$^{-2}$ and at an acceleration voltage of 50 KeV, using the photoresist pattern 102 as a mask. Annealing was then performed to diffuse the impurity in the bottom of the grooves 103 to respectively form n+-type regions 104 (FIG. 8C). Boron may be ion-implanted or diffused to form a p+-type channel stopper 104a as needed. However, the p+-type channel stopper 104a need not be formed depending on the process conditions.

Figure 8D:
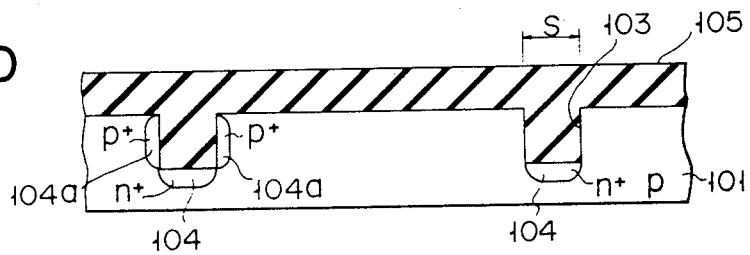

(ii) After the photoresist pattern 102 was removed, an SiO2 film was deposited by the CVD method to cover the entire surface of the silicon substrate 101 to a thickness (0.6 μm) greater than half (0.5 μm) of a width S of an opening of one of the grooves 103. At this time, the SiO2 film was gradually deposited on the p-type silicon substrate and in the inner surfaces of the grooves 103. As shown in FIG. 8D, the grooves 103 were completely filled with the SiO2 film. Thus, a CVD-SiO2 film 105 was formed. Unlike the conventional selective oxidation method in which thermal oxidation at a high temperature for a long period of time is required, the thermal oxidation need not be performed, so that the impurities in the n+-type region 104 and the p+-type region 104a are not redistributed.

Figure 8E:
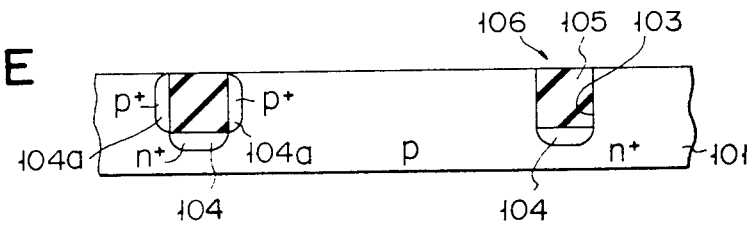
Figure 8F:
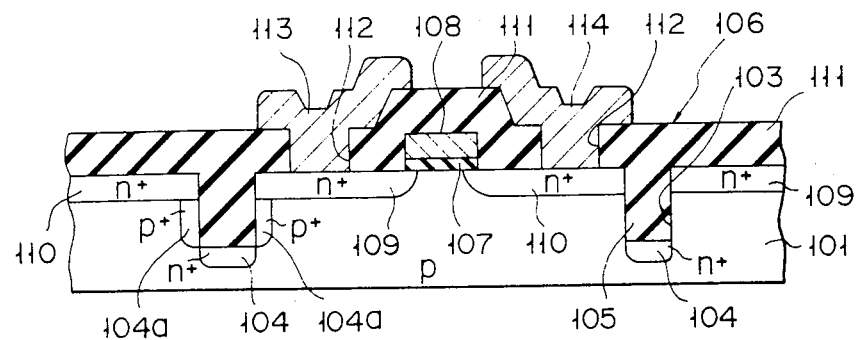

(iii) The CVD-SiO2 film 105 was then etched using an etchant of antimony fluoride to expose the surface of the silicon substrate 101 and to leave the CVD-SiO2 material in the grooves 103. At this time, the CVD-SiO2 film was etched to a depth corresponding to the thickness of the CVD-SiO2 film portion formed on the silicon substrate 101. As shown in FIG. 8E, the CVD-SiO2 material was left only in the grooves 103. Thus, a field region 106 embedded in the silicon substrate 101 was formed. Thereafter, in accordance with the conventional process, a gate electrode 108 of polycrystalline silicon was deposited, through a gate oxide film 107, on an island element formation region isolated by the field region 106. Arsenic was then diffused to form n+-type regions 109 and 110 which respectively function as the source and drain. An insulating interlayer 111 of CVD-SiO2 was deposited and was etched to form contact holes 112 (contact hole of the gate electrode is not illustrated) which respectively correspond to the gate electrode 108 and the n+-type regions 109 and 110. Thereafter, an aluminum film was deposited and patterned to form an aluminum source electrode 113, an aluminum drain electrode 114 and an aluminum gate electrode (not shown). Thus, an n-channel MOSLSI was prepared (FIG. 8F).

In the MOSLSI obtained in Example 1, since the field region 106 is determined by the width of the groove 103, the width of the field region can be as small as 1 μm. Thus, the field region can be micronized in the LSI which can be highly integrated. However, when a narrow field oxide film is formed according to the conventional selective oxidation as shown in FIG. 9, margins M1 and M2 between the n+-type buried layer and the n+-type layer formed in the surface layer of the substrate become short. Thus, a leakage current tends to flow between the n+-type layers. However, in the field region 106 obtained in Example 1, the depth of the field region 106 is as great as 2 μm even though its width is short as shown in FIG. 10, so that a current does not leak between the n+-type layers.

Further, after the field region 106 is formed, the surface of the substrate 101 between the field region and the element formation region is flat, as shown in FIG. 8E, so that excellent step coverage is provided when the aluminum electrodes 113 and 114 are deposited.

Further, unlike the conventional selective oxidation method, field oxidation need not be performed. Therefore, the substrate defect caused due to the mechanical stress encountered when the field oxide film extends under the Si3N4 film is eliminated. Further, as shown in FIG. 11, if the depth of a groove 103' among the grooves 103 is shallower than a diffusion depth xi of an n+-type layer 104$_1$, the n+-type layer 104$_1$ may contact an n+-type buried layer 104'. Therefore, a polycrystalline silicon wiring 108' can readily cross the n+-type buried layer 104'.

Further, all of the grooves 103 need not be filled with the n+-type layers. As shown in FIG. 12, the n+-type layers may be formed as needed, while the p+-type layers may be formed in the remaining grooves. Alternatively, the concentration of the impurity in the grooves need not be changed. Further, as shown in FIG. 13, the n+-type layer is partially formed in the groove 103.

Figure 14A:
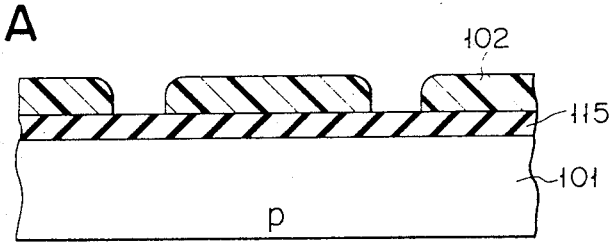
Figure 14B:
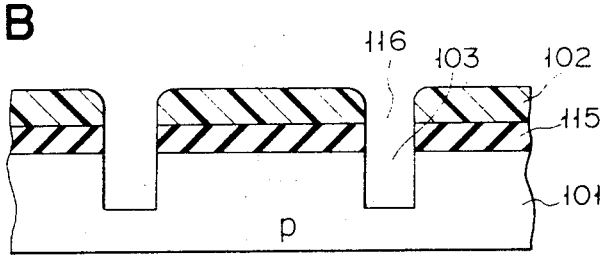
Figure 15A:
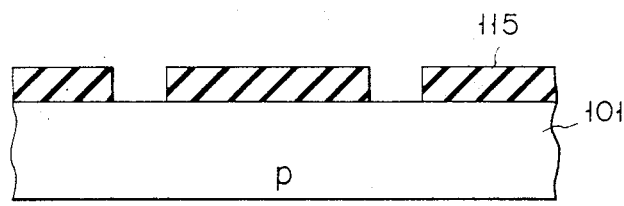
Figure 15B:
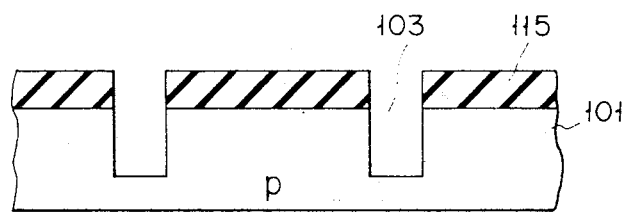

In Example 1, the photoresist pattern 102 is formed directly on the silicon substrate 101, and then grooves 103 are formed in the substrate 101 using the photoresist pattern 102 as a mask. However, as shown in FIG. 14A, after an insulating film is deposited on the silicon substrate 101, the photoresist pattern 102 may be formed thereon, and the insulating film 115 and the substrate 101 may be selectively etched by reactive ion etching using the photoresist pattern 102 as a mask. Thus, contact holes 116 can be formed (FIG. 14B). In this case, as shown in FIG. 15A, the insulating film 115 formed on the silicon substrate 101 may be patterned, and then the silicon substrate 101 may be etched by reactive ion etching using the insulating pattern to form the grooves 103 (FIG. 15B).

EXAMPLE 2

(i) As shown in FIG. 16A, three types of grooves 103, 103' and 103" which respectively had openings of widths S1, S2 and S3 were formed in a p-type silicon substrate 101 by photoetching utilizing reactive ion etching. The width S1 was smaller than the width S2, and the width S2 was smaller than the width S2. In the same manner as in Example 1, an impurity was doped in the grooves 103 and 103' at a dose of $1 \times 10^{16}$ cm$^{-2}$ to form n+-type regions 104, respectively. In this case, the wall and the bottom of the groove 103" were covered with the photoresist film, so that the impurity was not doped therein. A SiO2 film was then deposited to cover the surface of the p-type semiconductor substrate by the CVD method to a thickness larger than half the width S2 of the opening of the groove 103'. In this case, as shown in FIG. 16B, a CVD-SiO2 film 105 was filled in the grooves 103 and 103'. However, the CVD-SiO2 material was deposited only on the wall of the groove 103", so that a recess 117 was formed therein.

(ii) The CVD-SiO2 film 105 was then etched by antimony fluoride to a depth (about S2/2) corresponding to the thickness of the film formed on the substrate to form field regions 106 and 106' which were respectively filled in the grooves 103 and 103' whose widths of the openings were respectively S1 and S2. However, all the CVD-SiO$_2$ film formed in the groove 103" was etched. The recess of the groove 103" was used for a VMOS region in the subsequent process. Thus, the recess need not be formed after the field regions are formed. Thus, photoetching could be omitted.

EXAMPLE 3

(i) As shown in FIG. 17A, three types of grooves 103, 103' and 103" which respectively had widths S1, S2 and S3 of the openings were formed in a p-type silicon substrate 101 by reactive ion etching. The width S1 was smaller than the width S2, and the width S2 was smaller than the width S3. An impurity was doped in the grooves 103 and 103', while the wall and the bottom of the groove 103" were covered with the photoresist film, so that the impurity was not doped therein. A SiO$_2$ film was then deposited to cover the surface of the p-type semiconductor substrate by the CVD method to a thickness slightly larger than half the width S2 of the opening of the groove 103'. In this case, as shown in FIG. 17B, a CVD-SiO$_2$ film 105 was filled in the grooves 103 and 103'. However, the CVD-SiO$_2$ material was deposited only on the wall of the groove 103", so that a field region 106" was formed wherein the CVD-SiO$_2$ film was left in the grooves 103 and 103' and was completely etched from the groove 103".

EXAMPLE 4

Figure 18A:
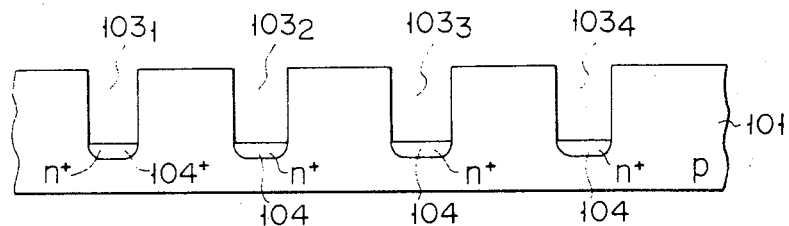
Figure 18B:
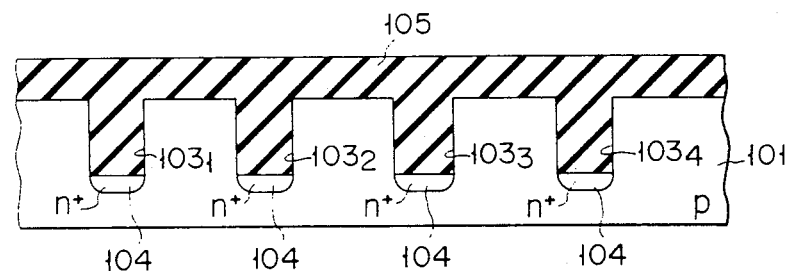

(i) As shown in FIG. 18A, a plurality of grooves $103_1$, $103_2$, $103_3$ and $103_4$ of the same width were formed in a p-type silicon substrate 101. Thereafter, an impurity such as phosphorus was then ion-implanted in the grooves at a dose of $1 \times 10^{16}$ cm$^{-2}$ to form n$^+$-type regions 104 in the bottom of the grooves, respectively. A CVD-SiO$_2$ film 105 was then deposited on the surface of the silicon substrate to cover the grooves $103_1$ to $103_4$ to a thickness greater than half the width of one of the openings of the grooves $103_1$ to $103_4$ (FIG. 18B).

Figure 18C:
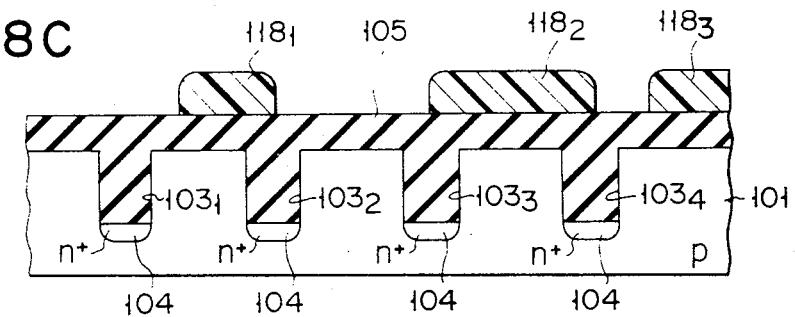
Figure 18D:
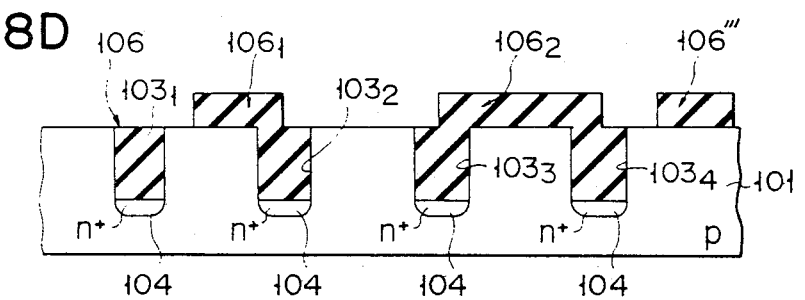

(ii) Photoresist patterns $118_1$, $118_2$ and $118_3$ were formed respectively on portions of the CVD-SiO$_2$ film: a portion extending from a point intermediate between the grooves $103_1$ and $103_2$ to substantially the center of the opening of the groove $103_2$; a portion extending substantially from the center of the opening of the groove $103_3$ to substantially the center of the opening of the groove $103_4$; and a portion extending from part of the substrate surface which is outside of the groove $103_4$ (FIG. 18C). Thereafter, the exposed portions of the CVD-SiO$_2$ film 105 were etched to expose the surface of the substrate 101 and to leave the CVD-SiO$_2$ material in the grooves, using the photoresist patterns $118_1$, $118_2$, $118_3$ and $118_4$ as masks. The photoresist patterns were then removed. As shown in FIG. 18D, a field region 106 was formed wherein the CVD-SiO$_2$ material was left in the groove $103_1$. A field region $106_1$ was formed wherein a CVD-SiO$_2$ portion which was formed on the surface of the substrate 101 was integral with a CVD-SiO$_2$ portion formed in the groove $103_2$. A field region $106_2$ was also formed wherein a CVD-SiO$_2$ portion which was formed on the surface of the substrate 101 was integral with CVD-SiO$_2$ portions formed in the grooves $103_3$ and $103_4$. A field region 106''' of a wide CVD-SiO$_2$ portion was also formed. For forming a plurality of MOS transistors on the silicon substrate 101 according to the conventional process, wiring layers could be formed using the field regions $106_1$, $106_2$ and 106'''. In Example 4, immediately after the n$^+$-type regions 104 were formed, arsenic was doped using photoresist patterns 118' as a mask. Thereafter, n$^+$-type regions 104' may be formed under the field regions $106_1$ and $106_2$ to be formed later (FIGS. 19A and 19B). Part of the n$^+$-type regions 104' may be changed to p$^+$-type regions as the channel stoppers.

EXAMPLE 5

Figure 20A:
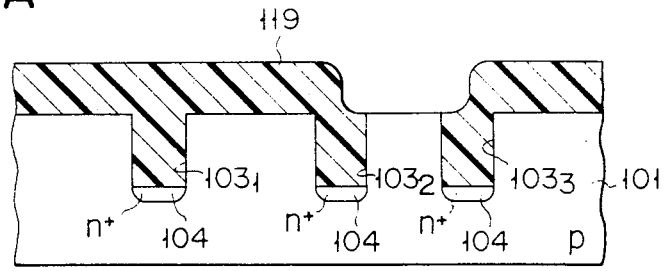
Figure 20B:
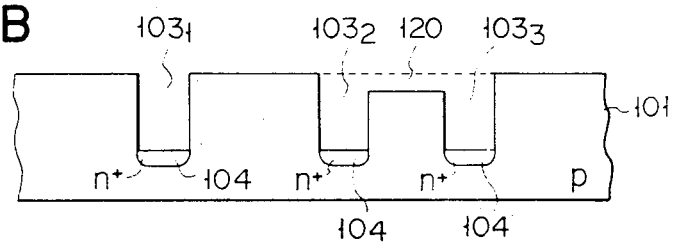

(i) Grooves $103_1$, $103_2$ and $103_3$ which had the same opening width were formed by photoetching utilizing reactive ion etching in a p-type silicon substrate 101. Thereafter, phosphorus was ion-implanted in the grooves $103_1$, $103_2$ and $103_3$ at a dose of $1 \times 10^{16}$ cm$^{-2}$ to form n$^+$-type regions 104 in the bottoms of the grooves $103_1$, $103_2$ and $103_3$. Thereafter, a photoresist pattern 119 was formed on the silicon substrate 101 so as to expose part of the silicon substrate 101 which extended from the groove $103_2$ to the groove $103_3$ (FIG. 20A). The exposed portion of the silicon substrate 101 was etched using the photoresist pattern 119 as a mask to form a recess 120, and then the photoresist pattern 119 was removed (FIG. 20B). The n$^+$-type regions 104 may be formed at this time.

Figure 20C:
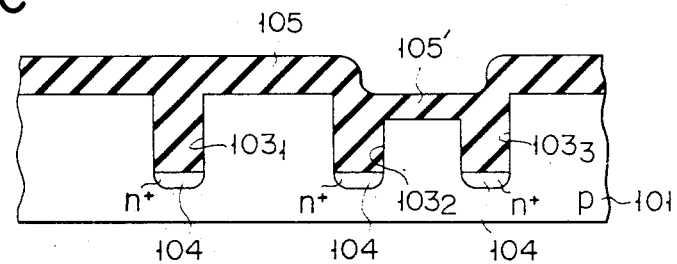

(ii) A CVD-SiO$_2$ film 105 was deposited to cover the entire surface to a thickness slightly larger than half the width of one of the grooves $103_1$ to $103_3$. At this time, as shown in FIG. 20C, the grooves $103_1$ to $103_3$ were filled with the CVD-SiO$_2$ material up to the openings. A CVD-SiO$_2$ film portion 105' corresponding to the recess 120 was recessed.

Figure 20D:
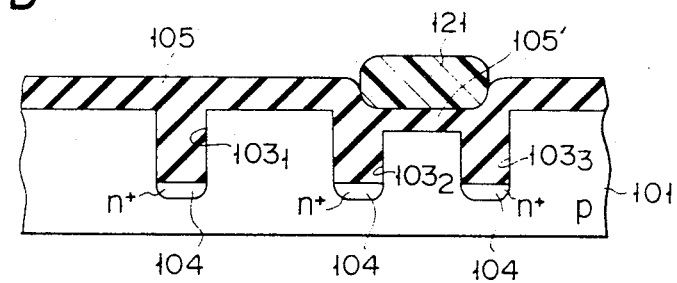
Figure 20E:
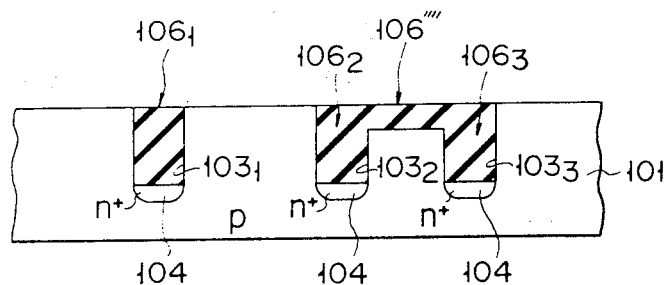

(iii) As shown in FIG. 20D, a photoresist pattern 121 was formed on the CVD-SiO$_2$ film portion 105', and the CVD-SiO$_2$ film 105 was etched by an etchant of antimony fluoride until the surface of the silicon substrate 101, except for the surfaces of the photoresist patterns 121 and the grooves $103_1$ to $103_3$, was exposed. Thus, field regions $106_1$ to $106_3$ were formed respectively in correspondence with to the grooves $103_1$ to $103_3$ in which the CVD-SiO$_2$ material was left. At the same time, a field region 106''' was formed wherein a CVD-SiO$_2$ portion had the same level as the surface of the silicon substrate 101 and was integral with CVD-SiO$_2$ portions left in the grooves $103_2$ and $103_3$ (FIG. 20E). Thereafter, for forming a plurality of MOS transistors in accordance with the conventional process, the field region 106''' which had the wide width and was formed on the silicon substrate 101 was used to deposit wiring layers. Further, since the field region 106''' had the same level as the surface of the silicon substrate 101, excellent step coverage was provided.

As shown in FIG. 21, a p$^+$-type region 104a as the channel stopper may be formed in the substrate portion under the field region 106'''.

EXAMPLE 6

Figure 22A:
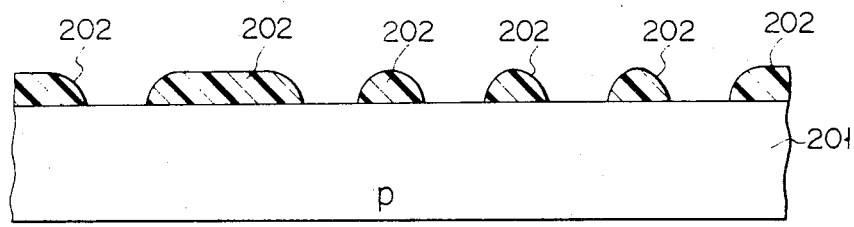
Figure 22B:
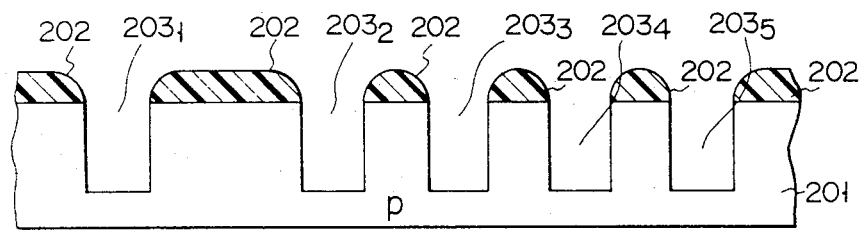
Figure 22C:
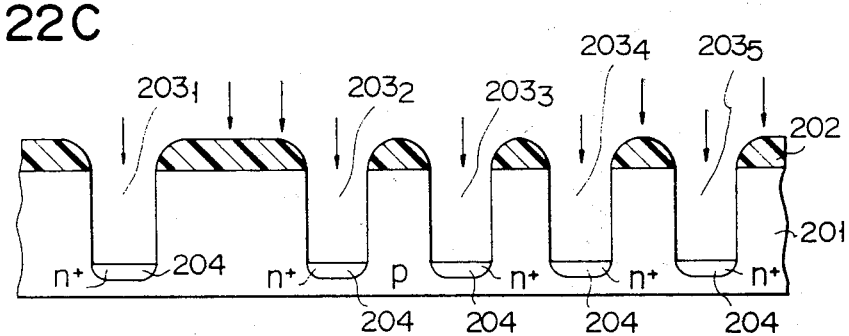

(i) Photoresist patterns 202 were formed by photoetching on a p-type silicon substrate 201 which had a crystal plane of (100) (FIG. 22A) except for groove formation regions. The silicon substrate 201 was then etched by reactive ion etching using the photoresist patterns 202 as a mask to form a plurality of first grooves $203_1$ to $203_5$ which respectively had substantially vertical walls, as shown in FIG. 22B. The groove $203_1$ had a width of 1.5 μm and a depth of 2 μm and was separated from other grooves. Each of the grooves $203_2$ to $203_5$ had a width of 1 μm and a depth of 2 μm. The grooves $203_2$ to $203_5$ were spaced apart from each other at intervals of 1 μm. An impurity such as phosphorus or arsenic whose conductivity type was opposite to that of the substrate 201 was ion-implanted in the grooves $203_1$ to $203_5$ at a dose of $1\times10^{16}$ cm$^{-2}$ and at an acceleration voltage of 50 KeV. Annealing was then performed to diffuse the impurity to form n$^+$-type regions 204 as the diffusion regions in the bottom of the grooves $203_1$ to $203_5$ (FIG. 22C).

Figure 22D:
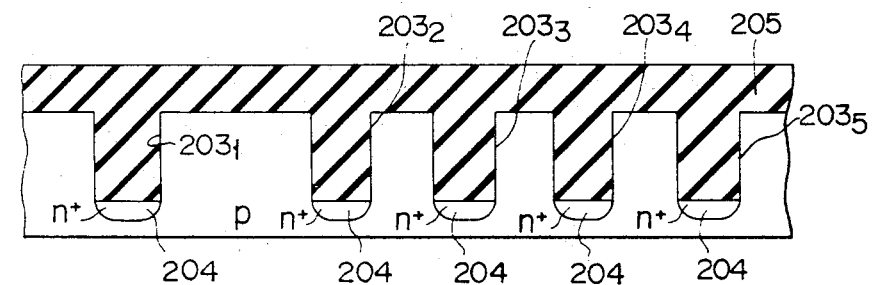

(ii) After the photoresist patterns 202 were removed, a CVD-SiO$_2$ film 205 was deposited on the surface of the silicon substrate 201 to a thickness (1.0 μm) greater than half (0.75 μm) the width of the opening of the groove $203_1$. At this time, the CVD-SiO$_2$ film 205 was gradually deposited on the surface of the silicon substrate 201 and the inner surfaces of the grooves $203_1$ to $203_5$. As shown in FIG. 22D, the CVD-SiO$_2$ film 205 was filled in the grooves $203_1$ to $203_5$. Unlike the conventional selective oxidation method wherein annealing was performed at a high temperature for a long period of time, annealing need not be performed. Thus, redistribution of the impurity did not substantially occur again in the n$^+$-type regions 204.

Figure 22E:
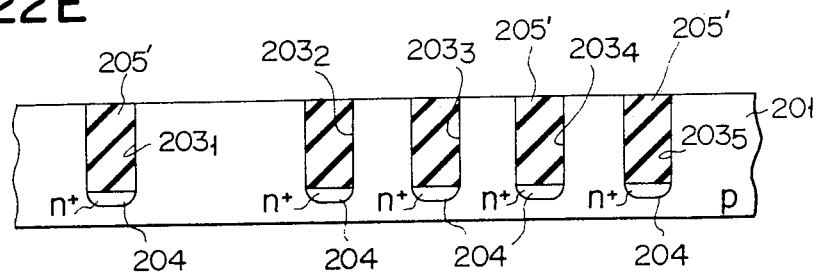

(iii) The CVD-SiO$_2$ film 205 was then etched by antimony fluoride to a thickness corresponding to a thickness of the CVD-SiO$_2$ portion on the silicon substrate 201 to expose the surface of the silicon substrate 201. As shown in FIG. 22E, CVD-SiO$_2$ portions 205' were respectively left in the first grooves $203_1$ to $203_5$.

Figure 22F:
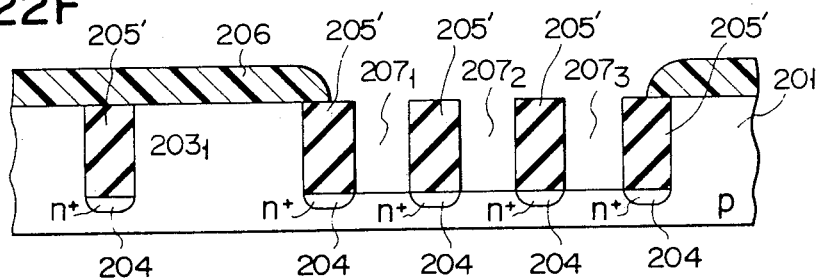
Figure 22G:
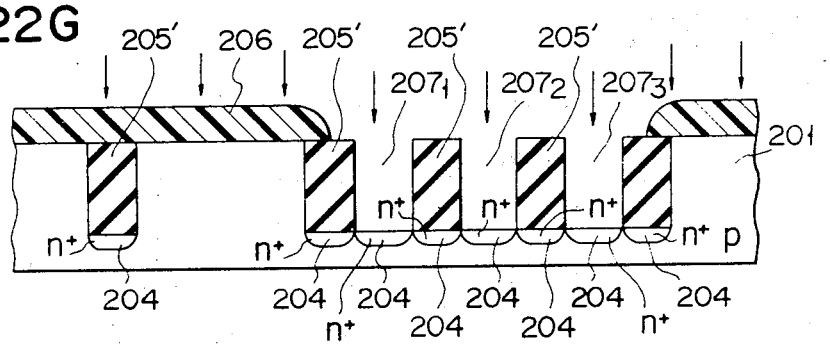

(iv) A photoresist pattern 206 was formed on the surface of the silicon substrate 201 except for a portion extending substantially from the center of the opening of the groove $203_2$ to substantially the center of the opening of the groove $203_5$, and reactive ion etching was performed to selectively etch parts of the silicon substrate 201 between the adjacent grooves $203_2$ to $203_5$, as shown in FIG. 22F. Thus, three second grooves $207_1$ to $207_3$ each of which had a width of 1 μm and a depth of 2 μm and which had substantially vertical walls were formed. An impurity such as phosphorus or arsenic whose conductivity type was opposite to that of the silicon substrate 201 was ion-implanted at a dose of $1\times10^{16}$ cm$^{-2}$ and at an acceleration voltage of 50 KeV, using the photoresist pattern 206 as a mask. Annealing was then performed to diffuse the impurity to form n$^+$-type regions 204' as diffusion regions in the bottoms of the second grooves $207_1$ to $207_3$ (FIG. 22G).

Figure 22H:
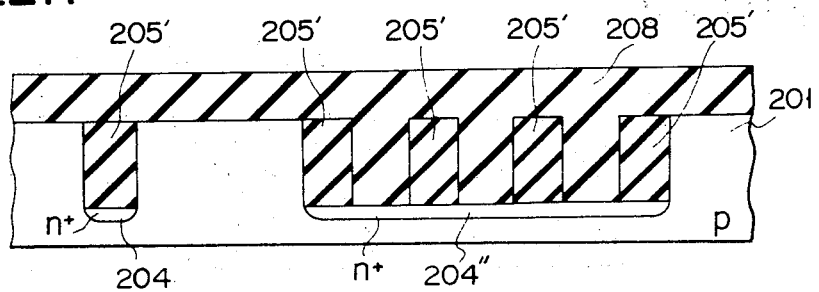

(v) After the photoresist film 206 was removed, a CVD-SiO$_2$ film 208 was deposited to a thickness (0.8 μm) greater than half (0.5 μm) the width of the opening of one of the grooves $207_1$ to $207_3$. At this time, the CVD-SiO$_2$ film 208 was gradually deposited on the surface of the silicon substrate 201 and on the inner surfaces of the second grooves $207_1$ to $207_3$. As shown in FIG. 22H, the CVD-SiO$_2$ film 208 was filled in the second grooves $207_1$ to $207_3$. In this process, the n$^+$-type regions 204 of the first grooves $203_2$ to $203_5$ were integral with the n$^+$-type regions 204' of the second grooves $207_1$ to $207_3$ to form a wide n$^+$-type region 204''.

Figure 22I:
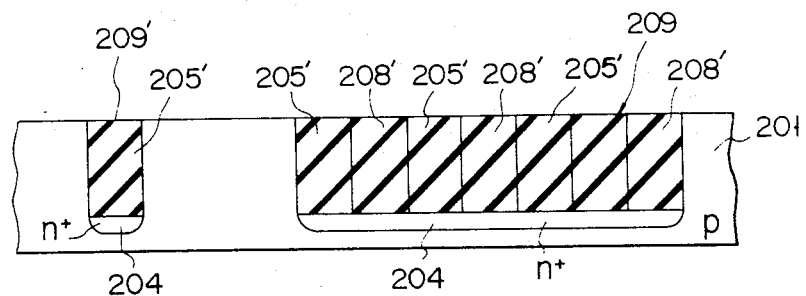
Figure 22J:
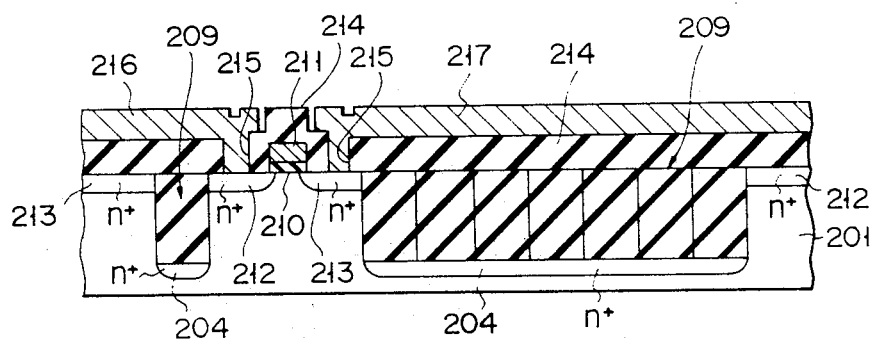

(vi) The CVD-SiO$_2$ film 208 was then etched by antimony fluoride to expose the surface of the silicon substrate 201. At this time, as shown in FIG. 22I, the CVD-SiO$_2$ film 208 was etched to a depth corresponding to the thickness of the CVD-SiO$_2$ film portion on the silicon substrate 201. Thus, CVD-SiO$_2$ film portions 208' were left in the second grooves $207_1$ to $207_3$. Thus, the CVD-SiO$_2$ film portions 205' left in the first grooves $203_2$ to $203_5$ became integral with the CVD-SiO$_2$ film portions 208' left in the second grooves $207_1$ to $207_3$ to form a field region 209 which had a great width (7 μm). The CVD-SiO$_2$ film portion 205' left in the first groove $203_1$ was used as a field region 209' which had a width of 1.5 μm. Thereafter, a gate electrode 211 of polycrystalline silicon was formed, through a gate oxide film 210, in an island element formation region isolated by the narrow field region 209' and the wide field region 209. Arsenic was then diffused to form n$^+$-type regions 212 and 213 which respectively function as the source and the drain. Further, an insulating interlayer 214 of CVD-SiO$_2$ was formed and etched to form contact holes 215 in the insulating interlayer 214, such that the contact holes corresponded to the gate electrode 211 and the n$^+$-type regions 212 and 213 (the contact hole of the gate electrode is not illustrated). An aluminum film was deposited by vapor deposition on the entire surface and was patterned to form an aluminum source electrode 216, an aluminum drain electrode 217 and an aluminum gate electrode (not shown). Thus, an n-channel MOSLSI was prepared (FIG. 22J).

The MOSLSI obtained in the above example has the narrow field region 209' and the wide field region 209. Further, since the field regions 209 and 209' are formed, the level of the element formation region of the silicon substrate 201 is the same as that of the field regions. Therefore, when the Al electrodes 216 and 217 are formed, excellent step coverage is provided between the field regions and the element formation region. Further, since the n$^+$-type regions 204 and 204'' as the buried diffusion regions are in the bottoms of the first grooves $203_1$ to $203_5$ and the second grooves $207_1$ to $207_3$, the impurity is not diffused to the element formation region, thus providing a highly integrated LSI. In order to contact the buried diffusion layer and the surface diffusion layer, the same process as in Example 1 may be performed.

Although the n$^+$-type regions are formed under the CVD-SiO$_2$ film portions 205' and the CVD-SiO$_2$ film portions 208' in the above example, the n$^+$-type regions may be formed under either the CVD-SiO$_2$ film portions 205' or 208' (FIGS. 23A and 23B). Alternatively, small parts of the regions under the CVD-SiO$_2$ film portions 205' or 208' may be formed as the n$^+$-type regions. Further, parts of the regions under the CVD-SiO$_2$ film portions 205' and 208' may be formed to be p$^+$-type regions. The n$^+$-type region and the p$^+$-type region may be mixed utilizing photoetching under the CVD-SiO$_2$ film portions 205' and/or 208'. Especially, as shown in FIG. 24, when the two ends of the field region are made of the p$^+$-type layers 204a and the center thereof is made of the n$^+$-type layer 204''', the clearance for the channel stopper effect is secured. In the example described above, after the first grooves and the second grooves are formed in the semiconductor substrate, all or part of the surface of the semiconductor substrate, or at least part of the grooves may be oxidized or nitrided to form an oxide or nitride film without blocking the grooves. In this case, an impurity may be doped before or after the formation of the oxide or nitride film.

In the example described above, after the insulating material is deposited on the semiconductor substrate which has the first grooves, or after the insulating material is deposited on the semiconductor substrate which has the second grooves, a low-melting point material may be doped on all or part of the surface layer of the insulating film. Thereafter, the doped layer of the insulating film may be melted.

Further, in the example described above, after the insulating material is deposited on the semiconductor substrate which has the first grooves, or after the insulating material is deposited on the semiconductor substrate which has the second grooves, a low-melting point insulating film may be deposited on all or part of the insulating film. Thereafter, the deposited insulating film may be melted.

EXAMPLE 7

Figure 25A:
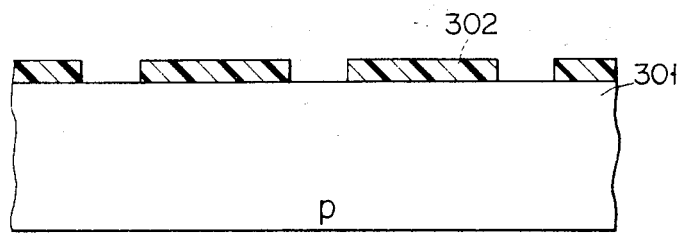

(i) A photoresist pattern 302 was formed on a p-type silicon substrate 301 with the crystal plane of (100) (FIG. 25A).

Figure 25B:
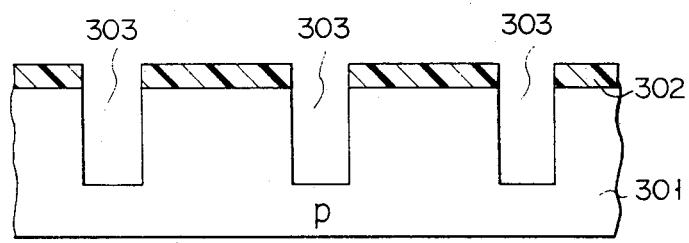

(ii) The silicon substrate 301 was then etched by ion etching or reactive ion etching using the photoresist pattern 302 as a mask, so that narrow grooves 303 which had vertical or substantially vertical walls were formed. Each of the grooves 303 had a depth of 2 μm (FIG. 25B).

Figure 25C:
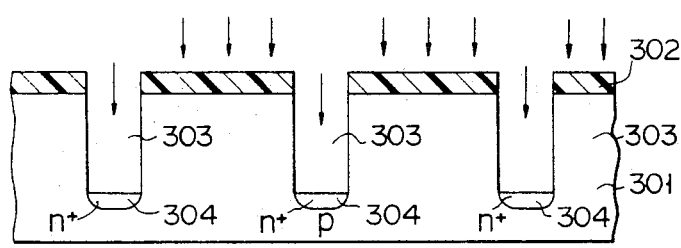

(iii) Phosphorus or arsenic was then ion-implanted in the grooves 303 at a dose of $1 \times 10^{16}$ cm$^{-2}$ and at an acceleration voltage of 50 KeV to form n$^+$-type regions (buried diffusion regions) 304 in the bottoms of the grooves 303 (FIG. 25C).

Figure 25D:
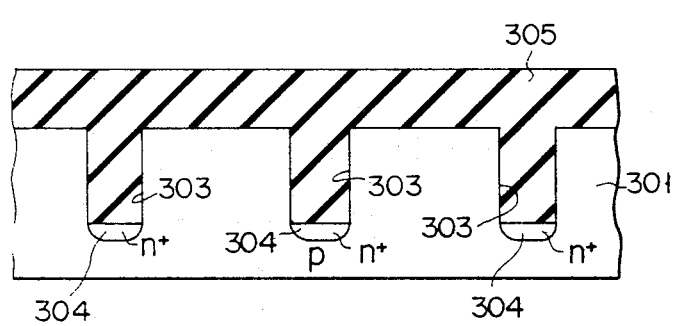

(iv) After the photoresist pattern 302 was removed, an insulating film 305 of CVD-SiO$_2$ or Si$_3$N$_4$ was deposited on the silicon substrate 301 to a thickness (0.6 μm) greater than half (0.5 μm) the width (1.0 μm) of the opening of one of the grooves 303. Thus, the CVD-SiO$_2$ film 305 was filled in the grooves 303 (FIG. 25D).

Figure 25E:
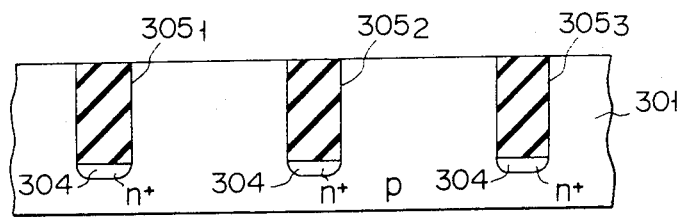

(v) The insulating film 305 was then etched to expose the silicon substrate 301. Thus, buried field insulating films 305$_1$, 305$_2$ and 305$_3$ were formed only in the grooves 303, respectively (FIG. 25E).

Figure 25F:
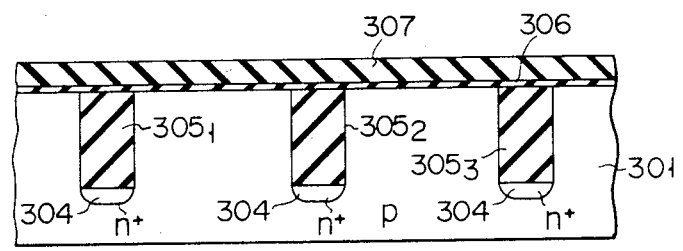
Figure 25G:
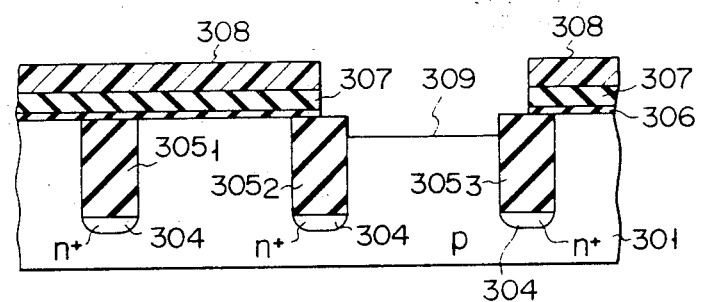

(vi) A thin insulating film (e.g., thermal oxide film of 500 Å thickness) 306 was formed on the silicon substrate 301. An antioxidant film (e.g., Si$_3$N$_4$ film of 3,000 Å thickness) 307 was deposited on the insulating film 306 (FIG. 25F).

(vii) A photoresist pattern 308 was formed except for a portion extending from the part of the buried field insulating film 305$_2$ to the part of the buried field insulating film 305$_3$. The antioxidant film 307 and the thin insulating film 306 were subsequently etched using the photoresist pattern 308 as a mask. Further, the exposed portion of the silicon substrate 301 was etched to form a groove 309. In this case, the buried field insulating films 305$_1$ to 305$_3$ must not be etched (FIG. 25G) to an unacceptable degree. The photoresist pattern 308 may be removed before the thin insulating film 306 or the exposed portion of the silicon substrate 301 is etched, and subsequent etching may be performed using the antioxidant film 307 as a mask. The etching depth of the silicon substrate 301 may be changed in accordance with oxidation conditions. In this example, the etching depth was 5,000 Å.

Figure 25H:
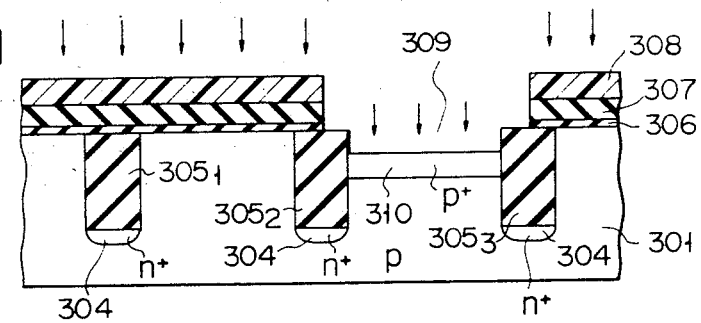

(viii) Boron was ion-implanted in the bottom of the groove 309 at a dose of $1 \times 10^{16}$ cm$^{-2}$ and at an acceleration voltage of 50 KeV to form a p$^+$-type region 310 using the photoresist pattern 308 (if the photoresist pattern 308 was removed in step (vii), the antioxidant film 307 is used) as a mask (FIG. 25H).

Figure 25I:
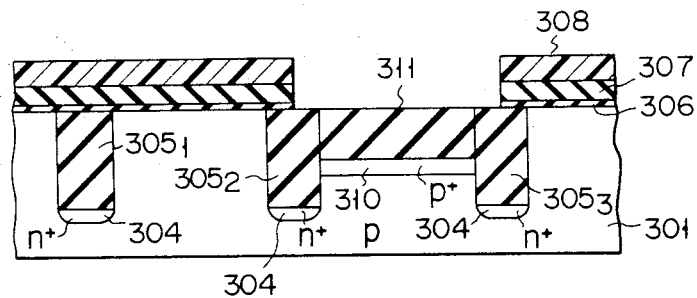

(ix) After the photoresist pattern 308 was removed, field oxidation was performed using the antioxidant film 307 as a mask to form a field oxide film 311 between the buried field insulating films 305$_1$ and 305$_2$ to a thickness of 1 μm. Thus, a wide field insulating film was formed. Since the field oxide film 311 had a thickness twice the etching depth of the silicon substrate 301, the level of the field insulating region was the same as that of the element formation region (FIG. 25I). If Si$_3$N$_4$ films are used for the buried field insulating films 305$_1$ and 305$_2$, the transverse extension (bird's beak) of the field insulating film 311 in the field oxidation process will not be substantially formed. Alternatively, when SiO$_2$ films are used for the buried field insulating films 305$_2$ and 305$_3$, the bird's beak will not be substantially formed.

Figure 25J:
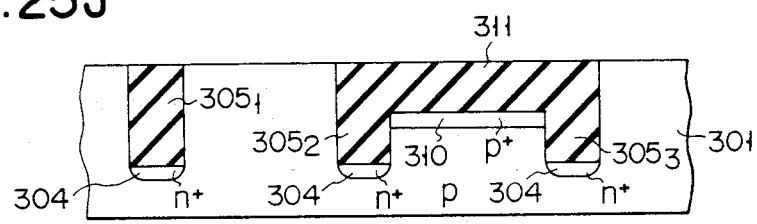

(x) The antioxidant film 307 and the thin insulating film 306 were sequentially etched (FIG. 25J).

Figure 25K:
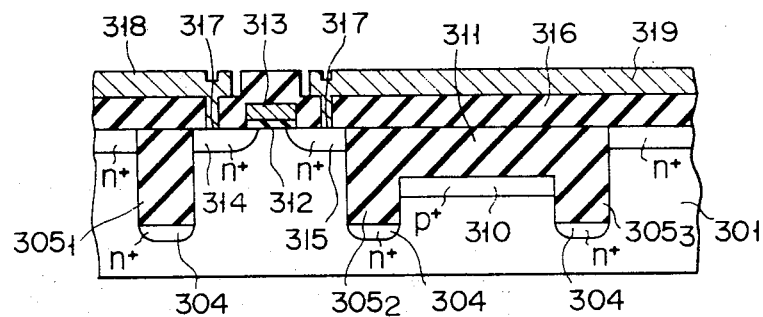

(xi) A gate oxide film 312 and a gate electrode 313 of polycrystalline silicon were formed. Arsenic was then diffused to form n$^+$-type regions 314 and 315 which respectively function as the source and the drain. An insulating interlayer 316 (e.g., CVD-SiO$_2$ film) was deposited to cover the entire surface and was selectively etched to form contact holes 317. Aluminum was then deposited in the contact holes 317 to form wirings 318 and 319. Thus, the main manufacturing process was completed (FIG. 25K).

By the above manufacturing process, various drawbacks which are encountered in the conventional selective oxidation method can be eliminated. Further, the buried diffusion layer is formed under the field film which has the same level as the silicon substrate and which has the desired width. Therefore, a highly integrated and high-performance LSI can be manufactured.

The relationship between the n$^+$-type layer and the p$^+$-type layer will be described with reference to FIGS. 26 and 27. Referring to FIG. 26, an n$^+$-type layer 304' may be formed under the field oxide film 311, and the n$^+$-type layers 304 are formed in the bottoms of the buried field insulating films 305$_1$ to 305$_3$. Alternatively, as shown in FIG. 27, although the n$^+$-type layer 304' is formed under the field oxide film 311, p$^+$-type layers 304a may be formed in the bottoms of the buried field insulating films 305$_1$ to 305$_3$; only part of the field regions need comprise an n$^+$-type layer.

EXAMPLE 8

Example 8 was substantially the same as Example 1 except that in step (i) boron instead of phosphorus was ion-implanted in grooves 103 at a dose of $1 \times 10^{16}$ cm$^{-2}$ and at an acceleration voltage of 50 KeV, and annealing was then performed to diffuse the impurity so as to form p$^+$-type regions 104' as the channel stoppers in the bottoms of the grooves 103. Thus, an n-channel MOSLSI was prepared, as shown in FIG. 28. The reference numerals used with reference to Example 1 denote the same parts in FIG. 28 unless otherwise indicated.

In the n-channel MOSLSI, the impurity concentration in the p$^+$-type region 104' can be increased, so that its sheet resistance is as low as 10 to 20 ohms/□. Therefore, the variations in the substrate potentials with respect time and space can be improved. Other effects are the same as those obtained in Example 1.

EXAMPLE 9

Example 9 was substantially the same as Example 2 except that boron was ion-implanted at a dose of $1 \times 10^{16}$ cm$^{-2}$. Thus, the semiconductor device shown in FIG. 29 was prepared. The semiconductor device was substantially the same as that in FIG. 16C except that p$^+$-type regions 104' were respectively formed in the bottoms of grooves 103 and 103'.

EXAMPLE 10

Example 10 was substantially the same as Example 4 except that boron was ion-implanted at a dose of $1\times10^{16}$ cm$^{-2}$. Thus, a semiconductor device shown in FIG. 30 was prepared. The semiconductor device was substantially the same as that in FIG. 18D except that p$^+$-type regions 104' were formed in the bottoms of grooves $103_1$ to $103_4$. In this case, as shown in FIGS. 19A and 19B, p$^+$-type regions may be formed under field regions $106_1$ and $106_2$ to be formed in the subsequent process (FIG. 31). Part of the p$^+$-type region may be formed as an n$^+$-type region if necessary. The n$^+$-type region may be used as a wiring layer.

EXAMPLE 11

Example 11 was substantially the same as Example 5 except that boron was ion-implanted at a dose of $1\times10^{16}$ cm$^{-2}$. Thus, a semiconductor device shown in FIG. 32 was prepared. The semiconductor device was substantially the same as that in FIG. 20E except that p$^+$-type regions 104' were formed in the bottoms of grooves $103_1$ to $103_3$. In this case, as shown in FIG. 33, an n$^+$-type region $104a'$ may be formed as a diffusion wiring layer in the substrate portion under the field region 106'''.

EXAMPLE 12

Example 12 was substantially the same as Example 6 except that boron was ion-implanted at a dose of $1\times10^{16}$ cm$^{-2}$ and at an acceleration voltage of 50 KeV. Thus, a semiconductor device was prepared wherein p$^+$-type regions 204' were formed as channel stoppers in the bottoms of narrow and wide field regions, as shown in FIG. 34.

As shown in FIGS. 35A and 35B, regions below CVD-SiO$_2$ film portions 205' or 208' or both comprise p$^+$-type regions.

Only parts of the regions below the CVD-SiO$_2$ film portions 205' and 208' film portions may comprise a p$^+$-type region. Further, the regions below either the CVD-SiO$_2$ film portions 205' or 208' may comprise p$^+$-type regions. Further, p$^+$-type regions and n$^+$-type regions (wiring layers) may be mixed utilizing photoetching independently of the CVD-SiO$_2$ film portions 205' and 208'. Especially, as shown in FIG. 36, when p$^+$-type regions 204' are respectively formed in the bottoms of two ends of the field region 209 and an n$^+$-type region $204a'$ is formed at the center thereof, an excellent channel stopper effect is provided.

EXAMPLE 13

Example 13 was substantially the same as Example 7 except that in step (iii) of Example 7 boron was ion-implanted in the grooves 303 at a dose of $1\times10^{16}$ cm$^{-2}$ and at an acceleration voltage of 50 KeV to form p$^+$-type regions 304', and that in step (viii) of Example 7 arsenic or phosphorus instead of boron was ion-implanted in the bottom of the groove 309 at a dose of $1\times10^{16}$ cm$^{-2}$ and at an acceleration voltage of 50 KeV to form an n$^+$-type region 310'. Thus, the semiconductor device shown in FIG. 37 was prepared. Other arrangements of the semiconductor device are the same as those in FIG. 25K.

The formation of the n$^+$-type layers and the p$^+$-type layers may be arbitrarily changed in the same manner described with reference to FIGS. 26 and 27.

For forming the grooves 303 in the silicon substrate 301, the photoresist film 302 is used as a mask in the example shown in FIGS. 25A to 25K. However, before photoetching, an insulating film 320 (e.g., SiO$_2$ film) is grown on the silicon substrate 301. Using a photoresist pattern 312 as a mask, the insulating film 320 and the silicon substrate 301 may be selectively etched to form a groove 303' (FIG. 38).

After the insulating film 320 is patterned (FIG. 39A), the exposed portion of the silicon substrate may be etched using the pattern of the insulating film 320 as a mask to form the groove 303 (FIG. 39B).

Further, before an insulating film 305 is buried, an insulating film 322 may be preformed in the groove 303 (FIG. 40). The insulating film 322 may be formed by oxidizing the silicon substrate 301. Alternatively, a CVD-SiO$_2$ film may be deposited in the groove 303. The width of the opening of the groove 303 is half the thickness of the insulating film 322.

For forming the buried field insulating films $305_1$ to $305_3$ which are left in the grooves 303 by only etching the insulating film 305, the buried field insulating films $305_1$ to $305_3$ may be recessed from the surface of the silicon substrate 301.

The depths of the buried field insulating films $305_1$ to $305_3$ may vary.

In the example shown in FIGS. 25A to 25K, after the antioxidant film 307 is deposited and patterned, the antioxidant film 307 and the silicon substrate 301 are etched. However, after the silicon substrate 301 is selectively etched to form the groove 309, the antioxidant film 307 may then be deposited and be selectively etched from the groove 309. Thereafter, field oxidation may be performed.

In the example shown in FIGS. 25A to 25K, after the antioxidant film 307 is etched and the silicon substrate 301 is etched to form the groove 309, field oxidation is performed. However, after the antioxidant film 307 is etched, the silicon substrate 310 may be etched without performing field oxidation (FIGS. 41A and 41B). In this case, the insulating film 306 need not be deposited. Further, even if the insulating film 306 is left like the SiO$_2$ film on the substrate, the thin insulating film 306 need not be etched and field oxidation can be performed unlike the case shown in FIG. 41A where the substrate (e.g., silicon substrate 301) is not oxidized in the field oxidation process.

Further, the field oxide film 311 may be etched using the antioxidant film 307 after the step shown in FIG. 41B is performed, so that a flat structure may be obtained (FIG. 42). In this case, even if field oxidation is performed without etching the silicon substrate 301, the above step may be applied to a case where the silicon substrate 301 is etched and then field oxidation is performed. This is very effective in a case where alignment between the field oxide film 311 and the silicon substrate 301 is not accomplished since the thick filed oxide film 311 is formed even if the silicon substrate 301 is etched.

Figure 43:
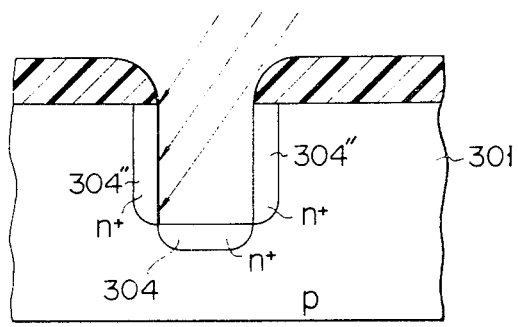

In Examples 1 to 7, an impurity whose conductivity type is opposite to that of the substrate is ion-implanted substantially perpendicularly to the surface of the silicon substrate 301. However, as shown in FIG. 43, the impurity may be obliquely ion-implanted with respect to the silicon substrate 301 to form n$^+$-type regions 304'' on the inner surfaces of the groove 303. The n$^+$-type regions 304'' may be formed by diffusion. The above ion-implantation may be applied to an impurity whose conductivity type is the same as that of the silicon substrate.

Figure 44A:
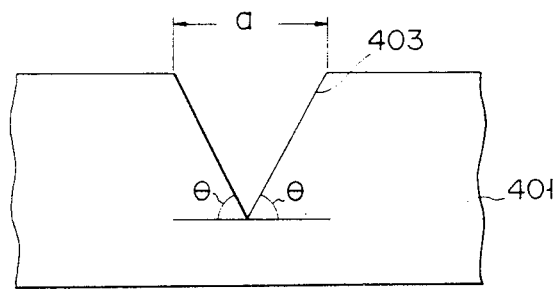
Figure 44B:
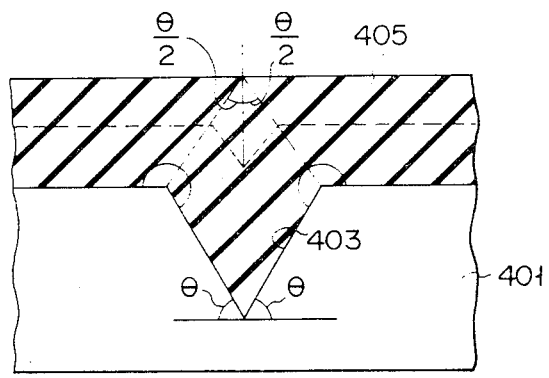

Further, in the above examples, the grooves have vertical or substantially vertical walls. However, the present invention is not limited to this. For example, a wedge-shaped groove 403 whose surface is inclined by an angle $\theta$ with respect to the surface of the silicon substrate may be formed as shown in FIGS. 44A and 44B. In this case, the thickness of an insulating film 405 is greater than $(a \times \cot(\theta/2))/2$ where a denotes the width of the opening of the groove. Further, a groove having tapered walls and a flat bottom may also be used.

Figure 45A:
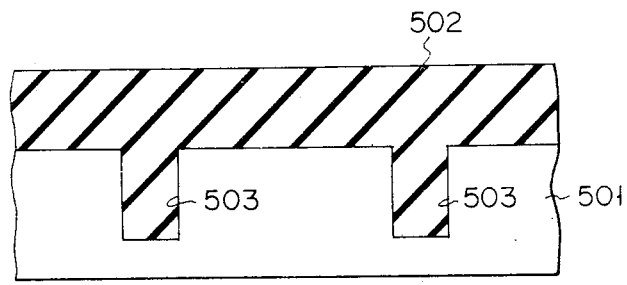
Figure 45B:
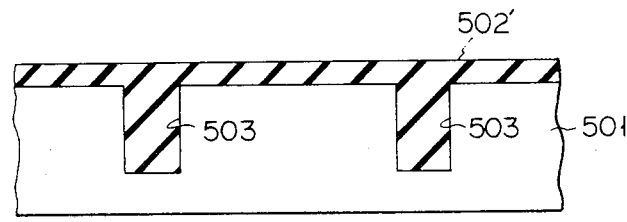

Further, as shown in FIG. 45A, an insulating film 502 formed on a substrate 501 need not be etched to expose the surface of the substrate 501. An insulating film 502' may be left on the surface of the substrate 501 as shown in FIG. 45B. The insulating film 502' may be used as a gate film or an insulating interlayer, or a part thereof.

Figure 46A:
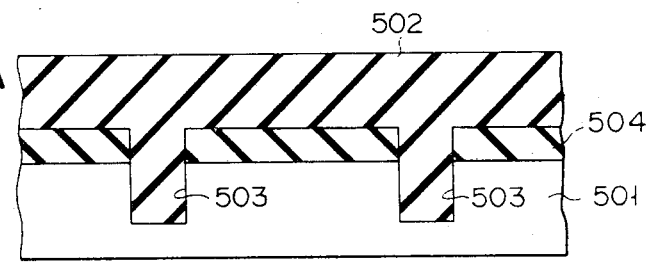
Figure 46B:
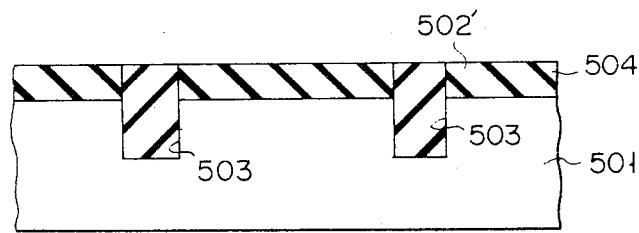

Further, as shown in FIG. 46A, grooves 503 are formed in the substrate 501 using a mask 504, and an insulating film 502 is then deposited on the mask 504. The insulating film 502 may be etched to leave the mask 504 on the substrate 501 (FIG. 46B).

What is claimed is:

1. A method for manufacturing a semiconductor device, comprising the steps of:
   (a) forming at least one groove which has vertical or substantially vertical wall in a desired portion of a semiconductor substrate;
   (b) selectively doping an impurity, whose conductivity type is opposite to that of said semiconductor substrate, in said at least one groove to form a wiring layer; and
   (c) depositing an insulating material to cover an entire surface of said semiconductor substrate including said at least one groove to a thickness greater than half the width of the shortest side of the opening of said at least one groove, and forming field region by etching the insulating film of said insulating material to leave said insulating material in said at least one groove.

2. The method according to claim 1, wherein said impurity in step (b) is ion-implanted in the bottom of said at least one groove to form a wiring layer.

3. The method according to claim 1, wherein after said at least one groove is formed in said semiconductor substrate and said impurity is ion-implanted, and before said insulating material is deposited, an oxide film or a nitride film which does not block said at least one groove is grown by oxidizing or nitrifying the entire surface of said semiconductor substrate or at least part of said at least one groove.

4. The method according to claim 1, wherein after said at least one groove is formed in said semiconductor substrate and before said impurity is ion-implanted, an oxide film or a nitride film which does not block said at least one groove is grown by oxidizing or nitrifying the entire surface of said semiconductor substrate or at least part of said at least one groove.

5. The method according to claim 1, wherein after said insulating film is deposited, a low-melting point material is doped on an entire surface layer or part of a surface layer of said insulating film and is annealed to melt a doped layer of said insulating film, and said insulating film is etched.

6. The method according to claim 1, wherein after said insulating material is deposited, a low-melting point insulating film is deposited on an entire surface or part of a surface of said insulating film and is melted, and said low-melting point insulating film and said insulating film are etched.

7. The method according to claim 1, wherein the forming step includes forming at least a second groove in the semiconductor substrate and an impurity whose conductivity type is the same as the conductivity type of said semiconductor substrate is doped in said second groove to form a channel stopper, and said impurity whose conductivity type is opposite to the conductivity type of said semiconductor substrate is doped in said at least one groove to form a wiring layer.

8. The method according to claim 7, wherein immediately after said impurity whose conductivity type is opposite to the conductivity type of said semiconductor substrate is doped in said at least one groove, said impurity whose conductivity type is the same as the conductivity type of said semiconductor substrate is doped in the second groove.

9. The method according to claim 1, wherein one part of said at least one groove is shallower than a diffusion depth of said impurity region formed in said semiconductor substrate, and the other part of said at least one groove is deeper than the diffusion depth of said impurity region, whereby a wiring layer which has a conductivity type opposite to the conductivity type of said semiconductor substrate and which is formed under said one part of said at least one groove is electrically connected to a region of said impurity region, which has the same conductivity type as the conductivity type of said semiconductor substrate.

10. A method for manufacturing a semiconductor device, comprising the steps of:
    forming at least one groove which has vertical or substantially vertical walls in a desired portion of a semiconductor substrate;
    selectively doping an impurity, whose conductivity type is opposite to said semiconductor substrate, in said at least one groove to form a wiring layer;
    depositing an insulating material on said semiconductor substrate including said at least one groove to a thickness greater than half of the width of the shortest said of the opening of said at least one groove;
    after forming a mask on at least one portion of the insulating film which includes part of the insulating film of said insulating material formed in and on said at least one groove and another part of said insulating film which corresponds to a prospective field region, etching said insulating film to leave said insulating material in said at least one groove said so as to form field regions in and out of said at least one groove.

11. The method according to claim 10, wherein after said at least one groove is formed in said semiconductor substrate, after or before impurity is ion-implanted and before said insulating material is deposited, an oxide film or a nitride film which does not block said at least one groove is grown by oxidizing or nitrifying an entire surface of said semiconductor substrate or at least part of said at least one groove.

12. The method according to claim 10, wherein after said insulating film is deposited, a low-melting point material is doped on an entire surface layer or part of a surface layer of said insulating film and is annealed to melt a doped layer of said insulating film, and said insulating film is etched after a mask is formed thereon.

13. The method according to claim 10, wherein after said insulating material is deposited, a low-melting point insulating film is deposited on an entire surface layer or part of said insulating film and is melted, and said low-melting point insulating film and said insulating film are etched after a mask is formed thereon.

14. A method according to claim 10, wherein the forming step includes forming at least a second groove in the semiconductor substrate and an impurity whose conductivity type is the same as the conductivity type of said semiconductor substrate is doped in said second groove to form a channel stopper, and said impurity whose conductivity type is opposite to the conductivity type of said semiconductor substrate is doped in said at least one groove to form a wiring layer.

15. The method according to claim 14, wherein immediately after said impurity whose conductivity type is opposite to the conductivity type of said semiconductor substrate is doped in said at least one groove, said impurity whose conductivity type is the same as the conductivity type of said semiconductor substrate is doped in said second groove.

16. The method according to claim 10, wherein one part of said at least one groove is shallower than a diffusion depth of said impurity region formed in said semiconductor substrate, and the other part of said at least one groove is deeper than the diffusion depth of said impurity region, whereby a wiring layer which has a conductivity type opposite to the conductivity type of said semiconductor substrate and which is formed under said one part of said at least one groove is electrically connected to a region of said impurity region, which has the same conductivity type as the conductivity type of said semiconductor substrate.

17. A method for manufacturing a semiconductor device, comprising the steps of:
    forming at least two adjacent first grooves which respectively have vertical or substantially vertical walls in desired portions of a semiconductor substrate;
    selectively doping an impurity, whose conductivity type is opposite to said semiconductor substrate, in at least one of said first grooves to form a wiring layer;
    depositing an insulating material to cover an entire surface of said semiconductor substrate including said first grooves to a thickness greater than half of the width of the shortest side of the opening of said first grooves;
    etching an insulating film of said insulating material to leave said insulating material in said first grooves;
    forming a second groove, by selectively etching said semiconductor substrate, between said first grooves which have said insulating material therein;
    depositing another insulating material to cover the entire surface of said semiconductor substrate to a thickness greater than half the width of the shortest side of the opening of said second groove;
    etching another insulating film of said another insulating material to expose the surface of said semiconductor substrate and to leave said another insulating material in said second groove, whereby said insulating material left in said first grooves becomes integral with said another insulating material left in said second groove to form a wide field region.

18. The method according to claim 17, wherein said impurity is doped immediately after said second groove is formed.

19. The method according to claim 17, wherein said impurity is doped after said first grooves are formed, and said impurity is also doped immediately after said second groove is formed.

20. The method according to claim 17, wherein after said first grooves and said second groove are formed, an oxide film or a nitride film which does not block said first and second grooves is formed by oxidizing or nitrifying the entire surface of said semiconductor substrate or at least part of said first and second grooves.

21. The method according to claim 20, wherein before said impurity which has a conductivity type opposite to the conductivity type of said semiconductor substrate is ion-implanted, an oxide film or a nitride film which does not block at least one of said first and second grooves is grown by oxidizing or nitrifying the entire surface of said semiconductor substrate or at least part of said first and second grooves.

22. The method according to claim 17, wherein after said insulating film is deposited on said semiconductor substrate which has at least said first grooves, or said insulating film is deposited on said semiconductor substrate which has said second groove, a low-melting point material is doped on an entire surface layer or part of a surface layer of said insulating film and is melted to form a doped layer of said insulating film.

23. The method according to claim 17, wherein after said insulating material is deposited on said semiconductor substrate which has at least said first grooves, or said insulating film is deposited on said semiconductor substrate which has said second groove, a low-melting point insulating film is deposited on an entire surface or part of a surface of said insulating film and is melted.

24. The method according to claim 17, wherein an impurity whose conductivity type is the same as the conductivity type of said semiconductor substrate is doped in one of said first and second grooves to form a channel stopper and an impurity whose conductivity type is opposite to the conductivity type of said semiconductor substrate is doped in another of said first and second grooves to form a wiring layer.

25. The method according to claim 24, wherein immediately after said impurity whose conductivity type is opposite to the conductivity type of said semiconductor substrate is doped, said impurity whose conductivity type is the same as the conductivity type of said semiconductor substrate is doped.

26. The method according to claim 24, wherein said impurity which is the same conductivity type as the conductivity type of said semiconductor substrate is doped before or after said first and second grooves are oxidized or nitrified so as not to block said first and second grooves.

27. The method according to claim 17, wherein one part of said first and second grooves is shallower than a diffusion depth of an impurity region formed in said semiconductor substrate, and the other part of said first and second grooves is deeper than the diffusion depth of said impurity region, whereby said wiring layer which has a conductivity type opposite to the conductivity type of said semiconductor substrate and which is formed under said one part of said first and second grooves is electrically connected to a region of said impurity region, which has a conductivity type opposite the conductivity type of said semiconductor substrate.

28. A method for manufacturing a semiconductor device, comprising the steps of:
forming first grooves which respectively have vertical or substantially vertical walls in desired portions of a semiconductor substrate;
doping an impurity, whose conductivity type is opposite to said semiconductor substrate, in at least one of said first grooves to form a wiring layer;
depositing an insulating material to cover an entire surface of said semiconductor substrate including said first grooves to a thickness greater than half the width of the shortest side of the opening of said first grooves;
etching an insulating film of said insulating material to expose the surface of said semiconductor substrate and to leave said insulating material in said first grooves;
depositing an antioxidant film on the surface of said semiconductor substrate on which said insulating film is left;
forming a second groove, by selectively etching part of a surface of said antioxidant film between said first grooves; and
performing field oxidation using said antioxidant film as a mask to form an oxide film between said first grooves, said oxide film being formed integrally with said insulating film left in said first grooves.

29. The method according to claim 28, wherein said impurity is doped immediately after said second groove is formed.

30. The method according to claim 28, wherein said impurity is first doped after said first grooves are formed, and said imputity is secondly doped after said second groove is formed.

31. The method according to claim 28, wherein after said antioxidant film is deposited on the surface of said semiconductor substrate, part of said antioxidant film, and said semiconductor substrate between said first grooves are etched to form a second groove which has said insulating film left in said first grooves on at least part of a side surface thereof, and said field oxidation is performed using said antioxidant film as a mask.

32. The method according to claim 28, wherein after said first grooves are formed in said semiconductor substrate, or after said impurity is doped, an oxide film or a nitride film which does not block said first grooves is formed by oxidizing or nitrifying the entire surface of said semiconductor substrate or at least part of said first grooves.

33. The method according to claim 28, wherein after said insulating film is deposited on said semiconductor substrate which has said first grooves, a low-melting point insulating film is deposited on an entire surface or part of a surface of said insulating film and is melted, and said insulating film and said low-melting point insulating film are etched.

34. The method according to claim 28, wherein after said second groove which has said insulating film left in said first grooves on side surfaces of said second groove is formed by selectively etching part of said semiconductor substrate between said first grooves in which said insulating film is left, an antioxidant film is deposited to cover the entire surface of said semiconductor substrate and is etched, and said field oxidation is performed using said antioxidant film as a mask.

35. The method according to claim 28, wherein after said field oxidation is performed, part of a field oxide film is etched using said antioxidant film as a mask to obtain a flat structure.

36. The method according to claim 28, wherein an impurity whose conductivity type is the same as the conductivity type of said semiconductor substrate is doped in one of said first and second grooves to form a channel stopper and an impurity whose conductivity type is opposite to the conductivity type of said semiconductor substrate is dopoed in another of said first and second grooves to form a wiring layer.

37. The method according to claim 36, wherein immediately after said impurity whose conductivity type is opposite to the conductivity type of said semiconductor substrate is doped, said impurity whose conductivity type is the same as the conductivity type of said semiconductor substrate is doped.

38. The method according to claim 36, wherein before or after said first and second grooves are oxidized or nitrified so as not to block said first and second grooves, said impurity whose conductivity type is the same as the conductivity type of said semiconductor substrate is doped.

39. The method according to claim 28, wherein one part of said first and second grooves is shallower than a diffusion depth of an impurity region formed in said semiconductor substrate, and the other part of said first and second grooves is deeper than the diffusion depth of said impurity region, whereby said wiring layer which has a conductivity type opposite to the conductivity type of said semiconductor substrate and which is formed under said one part of said first and second grooves is electrically connected to a region of said impurity region, which has the same conductivity type as the conductivity type of said semiconductor substrate.

* * * * *